(12) United States Patent
Sakamoto et al.

(10) Patent No.: US 9,001,091 B2
(45) Date of Patent: Apr. 7, 2015

(54) SCANNING-SIGNAL-LINE DRIVING CIRCUIT AND DISPLAY DEVICE INCLUDING SAME

(75) Inventors: Mayuko Sakamoto, Osaka (JP); Yasuaki Iwase, Osaka (JP); Isao Ogasawara, Osaka (JP); Takaharu Yamada, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 268 days.

(21) Appl. No.: 13/512,389

(22) PCT Filed: Jun. 17, 2010

(86) PCT No.: PCT/JP2010/060262
§ 371 (c)(1),
(2), (4) Date: Jun. 7, 2012

(87) PCT Pub. No.: WO2011/065045
PCT Pub. Date: Jun. 3, 2011

(65) Prior Publication Data
US 2012/0235983 A1    Sep. 20, 2012

(30) Foreign Application Priority Data

Nov. 30, 2009  (JP) ................................ 2009-271245

(51) Int. Cl.
*G09G 5/00* (2006.01)
*G11C 19/28* (2006.01)
(Continued)

(52) U.S. Cl.
CPC ............. *G11C 19/28* (2013.01); *G09G 3/3688* (2013.01); *G09G 2300/0426* (2013.01); *G09G 2310/0286* (2013.01); *G09G 2320/0223* (2013.01); *G11C 19/184* (2013.01); *G09G 3/3655* (2013.01);
(Continued)

(58) Field of Classification Search
CPC ............. G09G 2300/0426; G09G 2310/0286; G09G 2310/0298; G09G 2310/0291; G09G 2310/0294; G09G 2320/0223; G09G 3/3655; G09G 3/3677; G09G 3/3688
USPC ..................... 345/212, 100, 98, 60, 204, 211; 361/152; 349/110
See application file for complete search history.

(56) References Cited

U.S. PATENT DOCUMENTS

2001/0030722 A1* 10/2001 Murade .......................... 349/110
2003/0071777 A1*  4/2003 Kokubun et al. ................. 345/98
(Continued)

FOREIGN PATENT DOCUMENTS

JP    2004-157508 A    6/2004
JP    2005-227675 A    8/2005
(Continued)

*Primary Examiner* — Thuy Pardo
(74) *Attorney, Agent, or Firm* — Chen Yoshimura LLP

(57) ABSTRACT

In order to supply a low-level potential VSS from a trunk line for the low-level potential VSS to each stage of a shift register, a branch line and an auxiliary line are provided for every plurality of stages of the shift register, and the auxiliary lines are connected to the respective branch lines and the plurality of stages of the shift register. It is also possible to provide an auxiliary line having substantially the same length as the trunk line and to connect all of the branch lines and all of the stages in the shift register to this auxiliary line. A high-level potential VDD may also be supplied using the same method. Consequently, a scanning-signal-line driving circuit is provided in which the frame area and power consumption of a display panel can be reduced when formed on the display panel as an integral unit.

14 Claims, 23 Drawing Sheets

(51) Int. Cl.
*G09G 3/36* (2006.01)
*G11C 19/18* (2006.01)

(52) U.S. Cl.
CPC ...... *G09G 3/3677* (2013.01); *G09G 2310/0289* (2013.01); *G09G 2310/0291* (2013.01); *G09G 2310/0294* (2013.01)

(56) References Cited

U.S. PATENT DOCUMENTS

| | | | |
|---|---|---|---|
| 2003/0227433 A1 | 12/2003 | Moon | |
| 2005/0179037 A1 | 8/2005 | Fujita | |
| 2005/0180083 A1* | 8/2005 | Takahara et al. | 361/152 |
| 2006/0022201 A1 | 2/2006 | Kim et al. | |
| 2007/0171179 A1* | 7/2007 | Morosawa | 345/100 |
| 2008/0018572 A1 | 1/2008 | Shin et al. | |
| 2008/0024395 A1* | 1/2008 | Yuri et al. | 345/60 |
| 2008/0067511 A1 | 3/2008 | Kim | |
| 2008/0211760 A1 | 9/2008 | Baek et al. | |

FOREIGN PATENT DOCUMENTS

| | | |
|---|---|---|
| JP | 2006-39524 A | 2/2006 |
| JP | 2007-200452 A | 8/2007 |
| JP | 2007-316642 A | 12/2007 |
| JP | 2008-26865 A | 2/2008 |
| JP | 2008-146079 A | 6/2008 |
| WO | 03/087921 A1 | 10/2003 |

* cited by examiner

SCANNING-SIGNAL-LINE DRIVING CIRCUIT AND DISPLAY DEVICE INCLUDING SAME

TECHNICAL FIELD

The present invention relates to a display device and particularly to a scanning-signal-line driving circuit of an active matrix-type display device.

BACKGROUND ART

An active matrix-type display device has been known in the past in which a plurality of scanning signal lines and a plurality of video signal lines are disposed in a grid, and a plurality of pixel circuits are disposed in a matrix so as to correspond to the intersections of these signal lines. An active matrix-type display device is provided with a scanning-signal-line driving circuit which drives the scanning signal lines and a video-signal-line driving circuit which drives video signal lines. The scanning signal lines, video signal lines, scanning-signal-line driving circuit, and video-signal-line driving circuit are also called gate lines, source lines, a gate driver circuit, and a source driver circuit, respectively.

The scanning-signal-line driving circuit includes a shift register which operates based on a clock signal in order to sequentially select each of the scanning signal lines for a specified time. A specified fixed potential and a clock signal are supplied to each stage of the shift register in order to cause this shift register to operate. Various types of control signal (for example, a clear signal for initiation and a control signal for specifying a shift direction) may also be supplied to each stage of the shift register.

Furthermore, a method for forming a scanning-signal-line driving circuit integrally on a display panel formed with pixels (pixel circuits) is known as a method for reducing the size of an active matrix-type display device. The display panel formed integrally with the scanning-signal-line driving circuit is also called a gate driver monolithic panel. In cases where a scanning-signal-line driving circuit is formed on a display panel as an integral unit, the scanning-signal-line driving circuit is disposed in the outer periphery portion (hereinafter referred to as frame) of the area where the pixels are disposed (see FIG. 2, which will be described later). In such cases, the shift register is disposed near the area where the pixels are disposed, and trunk lines for supplying a fixed potential, a clock signal, and the like to each stage of the shift register are disposed on the outside of the shift register along an outer edge of the display panel. Moreover, branch lines are disposed in order to connect the trunk lines and each stage of the shift register.

Note that the following related art documents are known in relation to the invention of the present case. Various types of scanning-signal-line driving circuit are described in Patent Documents 1 to 7. It is indicated in Patent Documents 1 and 2 that a branch line CKj connected to a trunk line for a clock signal CLK2 is connected to two adjacent stages STj−1 and STj within a single shift register as shown in FIG. 24.

RELATED ART DOCUMENTS

Patent Documents

Patent Document 1: Japanese Patent Application Laid-Open Publication No. 2006-39524
Patent Document 2: Japanese Patent Application Laid-Open Publication No. 2007-316642
Patent Document 3: Japanese Patent Application Laid-Open Publication No. 2008-26865
Patent Document 4: Japanese Patent Application Laid-Open Publication No. 2004-157508
Patent Document 5: Pamphlet of WO 2003/87921
Patent Document 6: Japanese Patent Application Laid-Open Publication No. 2008-146079
Patent Document 7: Japanese Patent Application Laid-Open Publication No. 2007-200452

SUMMARY OF THE INVENTION

Problems to be Solved by the Invention

Trunk lines and branch lines are disposed in the frame of the display panel with which a scanning-signal-line driving circuit is integrally formed as described above. However, when the trunk lines and the branch lines are disposed, the frame area that does not directly contribute to display is increased. In cases where a shift register operates based on numerous clock signals, the number of the wiring lines disposed in the frame becomes large, so an increase in the frame area becomes particularly problematic. In addition, if a shift register is forcefully disposed in the frame having the same surface area as before even though the number of the wiring lines is increased, then the yield drops tremendously.

Furthermore, a branch line connected to a certain trunk line overlaps with another trunk line, and a capacitance is formed at the overlap section. This capacitance becomes a load capacitance for the trunk lines. When the load capacitance associated with the trunk lines is increased, power consumption of a display device is increased. Moreover, there is also a problem in that the scanning-signal-line driving circuit becomes more likely to malfunction due to weakened clock signals and fluctuations in the fixed potential.

For this reason, the present invention has as its object to provide a scanning-signal-line driving circuit in which the frame area and power consumption of a display panel can be reduced when formed on the display panel as an integral unit.

Means for Solving the Problems

A first aspect of the present invention is a scanning-signal-line driving circuit which drives a plurality of scanning signal lines disposed in the pixel region of a display device, the scanning-signal-line driving circuit including:
a fixed potential-use trunk line for supplying a fixed potential;
a plurality of branch lines connected to the fixed potential-use trunk line; and
a single or a plurality of shift registers including a plurality of stages that receive the supply of the fixed potential from the fixed potential-use trunk line via the branch lines,
wherein all of the stages included in the single or the plurality of shift registers form an array by being disposed in a line in a specified direction, and
wherein the number of the branch lines is smaller than the number of the stages included in the array.

A second aspect of the present invention is the first aspect of the present invention, further including
an auxiliary line connected to the branch lines and the plurality of stages included in the array.

A third aspect of the present invention is the second aspect of the present invention, wherein
the stages included in the array are grouped into respective groups each having a plurality of stages in the order of arrangement, a branch line and an auxiliary line are provided for each of the groups, and each of the auxiliary lines is connected to the corresponding branch line and the plurality of stages within the corresponding group.

A fourth aspect of the present invention is the first aspect of the present invention, wherein the array includes two or more stages having mutually different layouts.

A fifth aspect of the present invention is the fourth aspect of the present invention, wherein the array includes two adjacently disposed stages that share at least one of a wiring line, a contact, and a switching element.

A sixth aspect of the present invention is the first aspect of the present invention, wherein the stages included in the array are paired with two stages each in the order of arrangement, and one of the branch lines is provided for every two paired stages and is connected to these two stages.

A seventh aspect of the present invention is the sixth aspect of the present invention, wherein the two paired stages have a layout showing line symmetry with a boundary line as the axis of symmetry.

An eighth aspect of the present invention is the sixth aspect of the present invention, wherein the two paired stages share at least one of a wiring line, a contact, and a switching element.

A ninth aspect of the present invention is the second aspect of the present invention, wherein the auxiliary line is connected to all of the branch lines and all of the stages included in the array.

A tenth aspect of the present invention is the second aspect of the present invention, wherein the auxiliary line is narrower than the fixed potential-use trunk line.

An eleventh aspect of the present invention is the first aspect of the present invention, wherein the fixed potential-use trunk line is a wiring line for supplying a low-level fixed potential.

A twelfth aspect of the present invention is the first aspect of the present invention, wherein the fixed potential-use trunk line is a wiring line for supplying a high-level fixed potential.

A thirteenth aspect of the present invention is the first aspect of the present invention, further including a clear signal-use trunk line for supplying a clear signal and a plurality of clear signal-use branch lines connected to the clear signal-use trunk line, wherein the number of the clear signal-use branch lines is smaller than the number of the stages included in the array.

A fourteenth aspect of the present invention is the first aspect of the present invention, further including a clock signal-use trunk line for supplying a clock signal and a plurality of clock signal-use branch lines connected to the clock signal-use trunk line, wherein the number of the clock signal-use branch lines is smaller than the number of the stages that receive the supply of the clock signal from the clock signal-use trunk line among the stages included in the array.

A fifteenth aspect of the present invention is a display device including a display panel that includes a pixel region in which a plurality of scanning signal lines are disposed and the scanning-signal-line driving circuit according to any of the first to fourteenth aspects which is formed on the display panel as an integral unit.

Effects of the Invention

With the first aspect of the present invention, when the fixed potential-use trunk line and respective stages of the shift register are connected, the number of the branch lines can be reduced from the conventional configuration in which a branch line is provided for every single stage in the shift register, thus making it possible to reduce the frame area of the display panel. In addition, overlapping of the branch lines and other trunk lines is reduced compared to that in the past, so the load capacitance formed at the overlap sections of the wiring lines can be reduced. Consequently, it is possible to reduce the power consumption of the display device and to prevent circuit malfunction by reducing the fluctuations in the fixed potential and reducing clock signal delay. Furthermore, by making the clock signal-use trunk line narrower with a reduction in the clock signal delay being taken into account, the frame area can be reduced further.

With the second aspect of the present invention, as a result of an auxiliary line being provided, the fixed potential can be supplied from the fixed potential-use trunk line to respective stages of the shift register by using a fewer branch lines than in the past. Therefore, the frame area and power consumption can be reduced while properly supplying the fixed potential to respective stages of the shift register from the fixed potential-use trunk line.

With the third aspect of the present invention, as a result of a branch line and an auxiliary line being provided for every plurality of stages included in the array, the fixed potential can be supplied to respective stages of the shift register from the fixed potential-use trunk line using a fewer branch lines than in the past.

With the fourth aspect of the present invention, it is possible to reduce the circuit area and to reduce the frame area by laying out respective stages of the shift register with a high degree of freedom.

With the fifth aspect of the present invention, it is possible to reduce the circuit volume of the shift register and to reduce the frame area by sharing a wiring line, a contact, or a switching element between two adjacently disposed stages.

With the sixth aspect of the present invention, as a result of a branch line and an auxiliary line being provided for every two stages included in the array, the fixed potential can be supplied to respective stages of the shift register from the fixed potential-use trunk line using branch lines equal to half the number of stages included in the array.

With the seventh aspect of the present invention, as a result of a branch line being provided so as to correspond to two stages that are laid out in line symmetry, the fixed potential can be supplied to respective stages of the shift register from the fixed potential-use trunk line by using branch lines equal to half the number of stages included in the array. Moreover, by laying out two stages in line symmetry, the layout can be made easy.

With the eighth aspect of the present invention, it is possible to reduce the circuit volume of the shift register and to reduce the frame area by sharing a wiring line, a contact, or a switching element between two adjacently disposed stages.

With the ninth aspect of the present invention, by providing the auxiliary line connected to all of the branch lines and all of the stages included in the array, it is possible to use a smaller number of branch lines than in the past to supply the fixed potential from the fixed potential-use trunk line to respective stages of the shift register. Therefore, it is possible to reduce the frame area and power consumption while properly supplying the fixed potential from the fixed potential-use trunk line to respective stages of the shift register.

With the tenth aspect of the present invention, by making the auxiliary line narrower, it is possible to reduce the load capacitance formed at the overlap sections of the auxiliary line and other wiring lines. This makes it possible to reduce the power consumption of the display device and to prevent circuit malfunction by reducing the clock signal delay.

With the eleventh aspect of the present invention, when a low-level fixed potential is supplied from the fixed potential-use trunk line to respective stages of the shift register, the use of a smaller number of the branch lines than in the past makes it possible to reduce the frame area and power consumption.

With the twelfth aspect of the present invention, when a high-level fixed potential is supplied from the fixed potential-use trunk line to respective stages of the shift register, the use of a smaller number of the branch lines than in the past makes it possible to reduce the frame area and power consumption.

With the thirteenth aspect of the present invention, when a clear signal is supplied from the clear signal-use trunk line to respective stages of the shift register, the use of a smaller number of the clear signal-use branch lines than in the past makes it possible to reduce the frame area and power consumption.

With the fourteenth aspect of the present invention, when a clock signal is supplied from the clock signal-use trunk line to necessary stages of the shift register, the use of a smaller number of the clock signal-use branch lines than in the past makes it possible to reduce the frame area and power consumption.

With the fifteenth aspect of the present invention, it is possible to reduce the frame area and power consumption in a display device which includes a display panel with which a scanning-signal-line driving circuit is integrally formed.

DETAILED DESCRIPTION OF EMBODIMENTS

Figure 1:
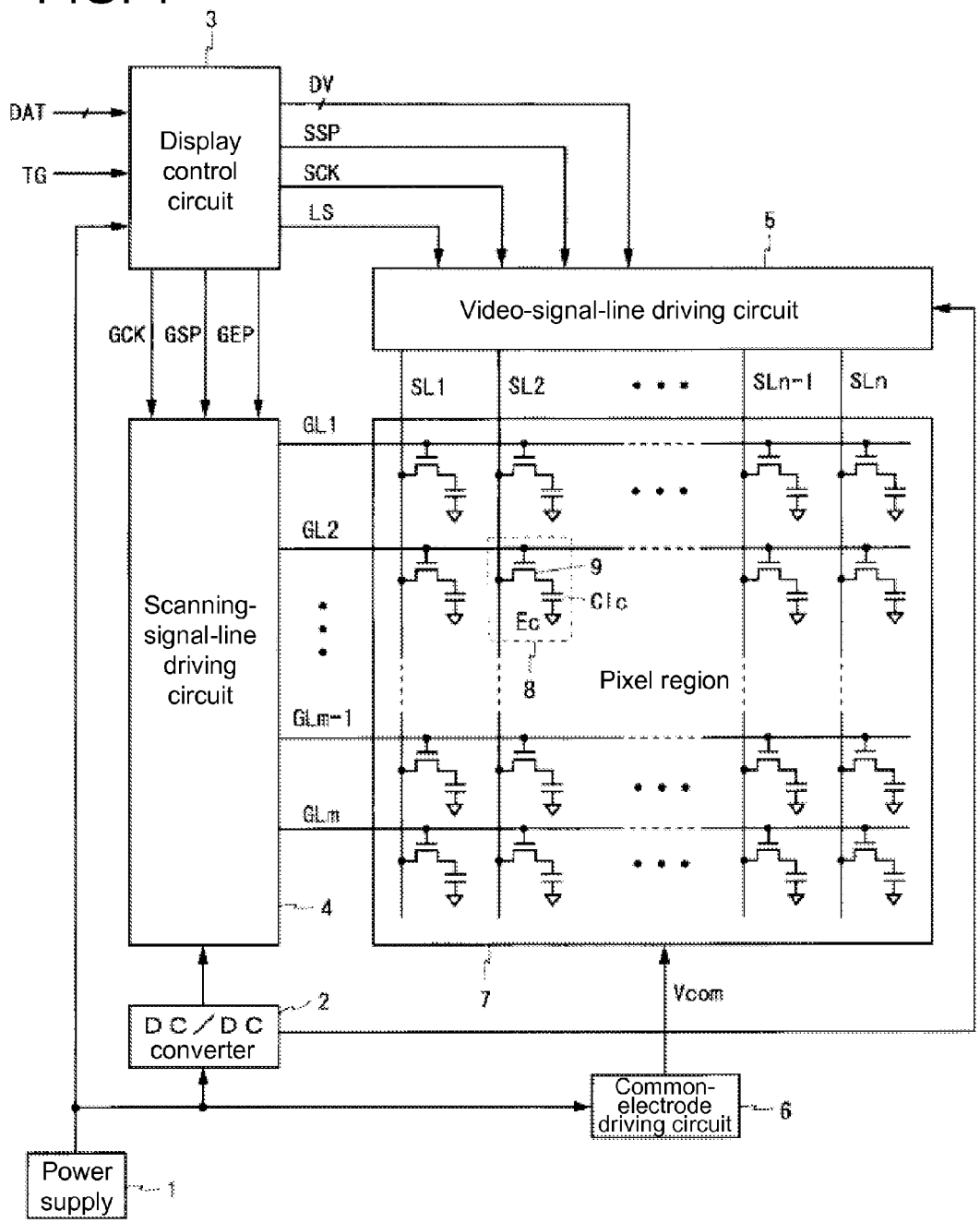
FIG. 1 is a block diagram showing the configuration of the liquid crystal display device according to an embodiment of the present invention.

FIG. 1 is a block diagram showing the configuration of the liquid crystal display device according to an embodiment of the present invention. The liquid crystal display device shown in FIG. 1 is an active matrix-type display device including a power supply 1, a DC/DC converter 2, a display control circuit 3, a scanning-signal-line driving circuit 4, a video-signal-line driving circuit 5, a common-electrode driving circuit 6, and a pixel region 7. Hereinafter, m denotes an even number, and n denotes an integer of two or greater.

The pixel region 7 includes m scanning signal lines GL1 to GLm, n video signal lines SL1 to SLn, and (m×n) pixel circuits 8. The scanning signal lines GL1 to GLm are disposed parallel to each other, and the video signal lines SL1 to SLn are disposed parallel to each other so as to be orthogonal to the scanning signal lines GL1 to GLm. The (m×n) pixel circuits 8 are provided so as to correspond to the intersections between the scanning signal lines GL1 to GLm and the video signal lines SL1 to SLn.

Each of the pixel circuits 8 contains a thin-film transistor (hereinafter referred to as TFT) 9 and a liquid crystal capacitor Clc. The gate terminal of the TFT 9 is connected to the corresponding scanning signal line, the source terminal is connected to the corresponding video signal line, and the drain terminal is connected to one of the electrodes of the liquid crystal capacitor Clc. The other electrode of the liquid crystal capacitor Clc is an opposite electrode Ec that faces all of the pixel circuits 8. Each pixel circuit 8 functions as a single pixel (or a single subpixel). Note that each pixel circuit 8 may also include an auxiliary capacitor in parallel to the liquid crystal capacitor Clc.

The power supply 1 supplies a specified power supply voltage to the DC/DC converter 2, the display control circuit 3, and the common-electrode driving circuit 6. The DC/DC converter 2 generates a specified direct-current voltage on the basis of the power supply voltage supplied from the power supply 1 and supplies it to the scanning-signal-line driving circuit 4 and the video-signal-line driving circuit 5. The common-electrode driving circuit 6 applies a specified potential Vcom to the common electrode Ec.

The display control circuit 3 outputs a digital video signal DV and a plurality of control signals on the basis of an image signal DAT and a timing signal group TG that are supplied from the outside. The timing signal group TG includes a horizontal synchronizing signal, a vertical synchronizing signal, and the like. The control signals output from the display control circuit 3 include a source start pulse signal SSP, a source clock signal SCK, a latch strobe signal LS, a gate clock signal GCK, a gate start pulse signal GSP, and a gate end pulse signal GEP. The term "gate clock signal GCK" includes two or more gate clock signals. The terms "gate start pulse signal GSP" and "gate end pulse signal GEP" may each be a single signal or may each include two or more signals.

The scanning-signal-line driving circuit 4 sequentially selects one scanning signal line out of the scanning signal lines GL1 to GLm on the basis of the gate clock signal GCK, gate start pulse signal GSP, and gate end pulse signal GEP that are output from the display control circuit 3, and applies a specified potential (here, a high-level potential) to the selected scanning signal line. Consequently, the n pixel circuits 8 connected to the selected scanning signal line are selected all at once.

The video-signal-line driving circuit 5 respectively applies n grayscale voltages corresponding to the digital video signal DV to the video signal lines SL1 to SLn on the basis of the digital video signal DV, source start pulse signal SSP, source clock signal SCK, and latch strobe signal LS that are output from the display control circuit 3. Consequently, the n grayscale voltages are respectively written to the n pixel circuits 8 that are selected by using the scanning-signal-line driving circuit 4. As a result of the grayscale voltages being written to all of the pixel circuits 8 within the pixel region 7 by using the scanning-signal-line driving circuit 4 and the video-signal-line driving circuit 5, an image based on the image signal DAT can be displayed in the pixel region 7.

Figure 2:
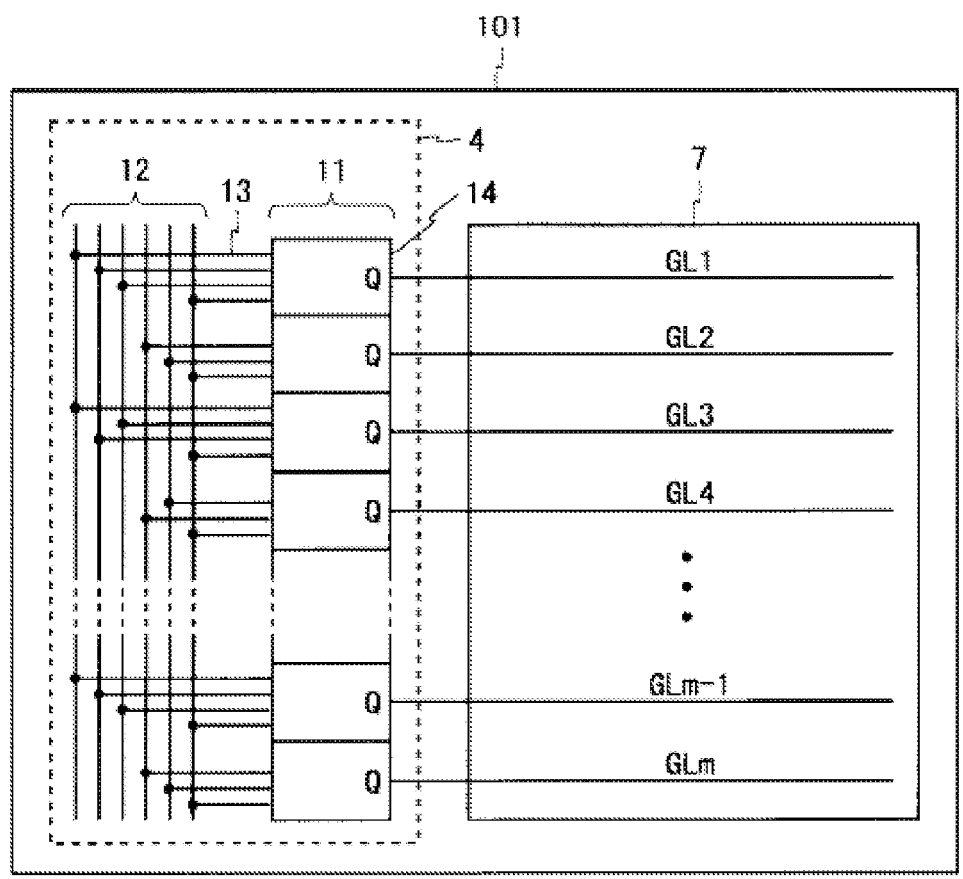
FIG. 2 is a diagram showing a schematic configuration and positional arrangement of a scanning-signal-line driving circuit included in the liquid crystal display device shown in FIG. 1.

FIG. 2 is a diagram showing a schematic configuration and positional arrangement of the scanning-signal-line driving circuit 4. As shown in FIG. 2, the scanning-signal-line driving circuit 4 is formed integrally on the liquid crystal panel 101 that includes the pixel region 7 in which the scanning signal lines GL1 to GLm are disposed. To elaborate this, the scanning-signal-line driving circuit 4 includes trunk lines 12, branch lines 13, and a shift register 11 that contains m bistable circuits 14. Each of the bistable circuits 14 has two states and becomes either one of the states at any point in time to output a signal which indicates this state (hereinafter referred to as state signal Q).

The shift register 11 is configured by connecting the m bistable circuits 14 in series. Alternatively, the shift register 11 may also include a shift register with the odd-numbered stages in which m/2 bistable circuits 14 are connected in series and a shift register with the even-numbered stages in which m/2 bistable circuits 14 are connected in series. In either of the cases, the m bistable circuits 14 included in the shift register 11 form an array by being disposed in a line in the direction of extension of the trunk lines 12 (hereinafter referred to as one-dimensional array). Thus, the scanning-signal-line driving circuit 4 includes a single or a plurality of shift registers, and all of the stages included in the single or the plurality of shift registers form an array by being disposed in a line in a specified direction.

When the scanning-signal-line driving circuit 4 is formed on the liquid crystal panel 101 as an integral unit, the scanning-signal-line driving circuit 4 is disposed in the outer peripheral portion of the pixel region 7 (in the frame of the liquid crystal panel 101). In this case, the shift register 11 is disposed near the pixel region 7. The trunk lines 12 are wiring lines for supplying fixed potentials, clock signals, and the like to various stages of the shift register 11 and are disposed on the outside of the shift register 11 along an outer edge of the liquid crystal panel 101. The branch lines 13 are wiring lines for connecting the trunk lines 12 and various stages (bistable circuits 14) of the shift register 11. The direction of extension of the trunk lines 12 and the direction of extension of the branch lines 13 are orthogonal to each other. The i-th scanning signal line GLi (i is an integer from one to m) is driven on the basis of the state signal Q that is output from the i-th stage (bistable circuit 14 of the i-th stage) in the shift register 11.

Note that when the scanning-signal-line driving circuit 4 is formed integrally on the liquid crystal panel 101, the TFTs included in the shift register 11 are formed by using amorphous silicon, microcrystalline silicon, and oxide semiconductor, for example.

Figure 3:
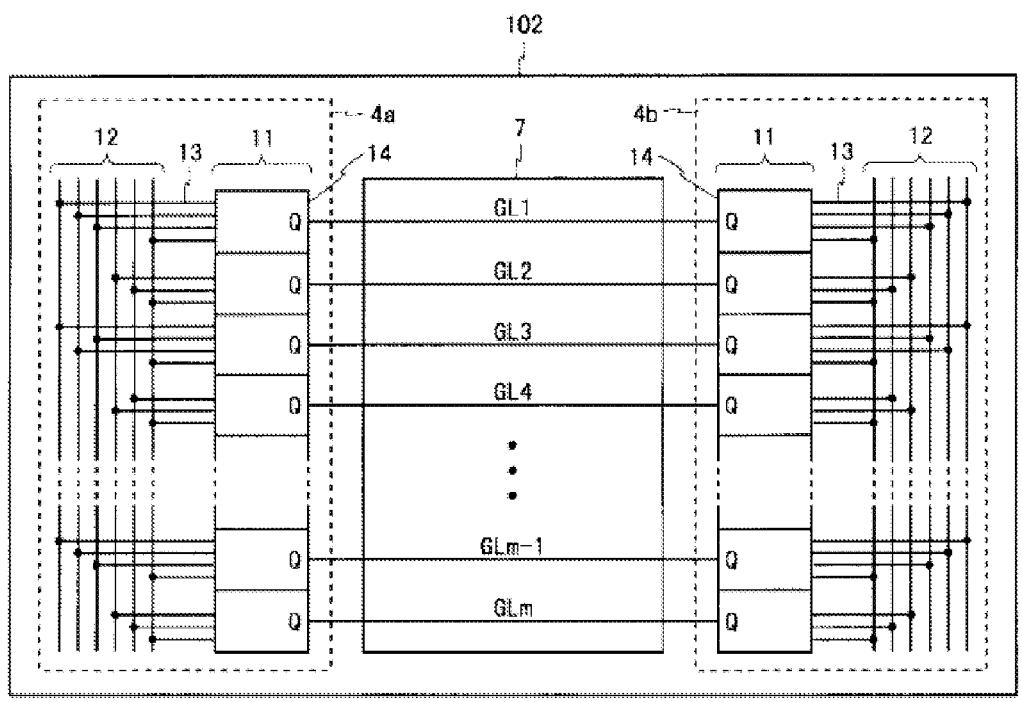
FIG. 3 is a diagram showing another positional arrangement of a scanning-signal-line driving circuit included in the liquid crystal display device shown in FIG. 1.

In the liquid crystal panel 101 shown in FIG. 2, the scanning-signal-line driving circuit 4 is disposed on one side of the pixel region 7 such that the scanning signal lines GL1 to GLm are driven from the one side. Instead of this, it is also possible to dispose two scanning-signal-line driving circuits 4a and 4b having the same configuration on both sides of the pixel region 7 and to have the scanning signal lines GL1 to GLm driven from both sides as in the liquid crystal panel 102 shown in FIG. 3. The configuration shown in FIG. 3 makes it possible to eliminate insufficient charging in a large display panel in which the loads of the scanning signal lines are large. Note that FIGS. 2 and 3 are figures showing the schematic configurations and positional arrangement of the scanning-signal-line driving circuits 4 and do not accurately indicate the connection between the trunk lines 12 and the branch lines 13.

The characteristic feature of the liquid crystal display device according to embodiments of the present invention lies in a manner in which a fixed potential is supplied to the shift register included in the scanning-signal-line driving circuit. The scanning-signal-line driving circuits according to first to fifth embodiments of the present invention will be described below with reference to FIGS. 4 to 11D. The scanning-signal-line driving circuits shown below correspond to the scanning-signal-line driving circuits 4 in FIGS. 1 to 3. In the description of each embodiment, the constituent elements that are the same as the constituent elements included in the previous embodiment are assigned the same reference characters, and a description thereof will be omitted.

First Embodiment

Figure 4:
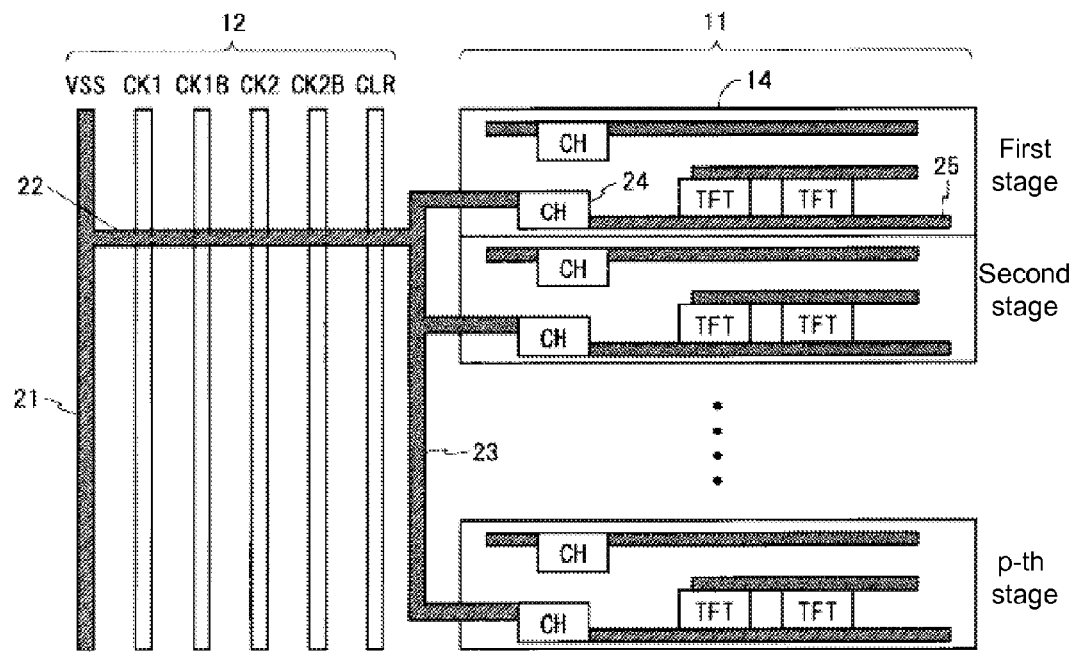
FIG. 4 is a model diagram showing the layout of the scanning-signal-line driving circuit according to a first embodiment of the present invention.

FIG. 4 is a model diagram showing the layout of the scanning-signal-line driving circuit according to a first embodiment of the present invention. In FIG. 4, wide straight lines or polygonal lines represent wiring lines, rectangular shapes with TFT written in them represent thin-film transistors, and rectangular shapes with CH written in them represent contacts (the same notations will be used in FIGS. 5 to 9). In the first embodiment, the term "gate clock signal GCK" includes four gate clock signals CK1, CK1B, CK2, and CK2B, and a fixed low-level potential VSS, the four gate clock signals, and a clear signal CLR are supplied to various stages of the shift register 11. A wiring line for supplying the low-level potential VSS to the first to p-th stages (p is an integer of two or more) of the shift register 11 is described in FIG. 4. The low-level potential VSS is supplied to the other stages of the shift register 11 as well using the same method. The four gate clock signals and the clear signal CLR are supplied to various stages of the shift register 11 using wiring lines that are not illustrated.

The trunk lines 12 include a trunk line 21 for VSS, trunk lines for CK1, CK1B, CK2, and CK2B, and a trunk line for CLR. These six trunk lines extend in the vertical direction in FIG. 4. The m bistable circuits 14 included in the shift register 11 form a one-dimensional array by being disposed in a line in the direction of extension of the trunk lines 12. The m bistable circuits 14 included in the one-dimensional array are grouped into sets of p in the order of arrangement. In order to supply the low-level potential VSS to the p bistable circuits 14 in a group, one branch line 22 and one auxiliary line 23 are provided for each group. One end (the left end in FIG. 4) of the branch line 22 is connected to the trunk line 21 for VSS. The branch line 22 extends in a direction orthogonal to the trunk line 21 for VSS. The other end (the right end in FIG. 4) of the branch line 22 is connected to the auxiliary line 23.

The auxiliary line 23 has a portion extending in a direction orthogonal to the branch line 22 and a portion extending in a direction parallel to the branch line 22 (hereinafter, the former is referred to as a first portion, and the latter is referred to as a second portion; there are p second portions). The first portion is disposed on the outside of the area where the shift register 11 is disposed (more specifically, between the shift register 11 and the trunk lines 12). One end (the right end in FIG. 4) of the second portion is connected to a contact 24 provided in the corresponding bistable circuit 14. The source terminals of some of the TFTs included in a bistable circuit 14 are connected to an internal wiring line 25 (wiring line within a bistable circuit 14) which is connected to the contact 24. Thus, auxiliary line 23 are connected to the corresponding one of the branch lines 22 and the p stages within the corresponding group.

Each of the m bistable circuits 14 included in the shift register 11 receives the supply of the low-level potential VSS from the trunk line 21 for VSS via the corresponding branch line 22 and auxiliary line 23. Furthermore, the number of the branch lines 22 is m/p, and the number of the stages included in the one-dimensional array is m. Therefore, it can be said that the number of the branch lines 22 is smaller than the number of the stages included in the one-dimensional array.

As shown above, the scanning-signal-line driving circuit according to the present embodiment includes the fixed potential-use trunk line (trunk line 21 for VSS) for supplying the fixed potential (low-level potential VSS), the plurality of branch lines 22 connected to the fixed potential-use trunk line, and the shift register 11 containing the plurality of stages (bistable circuits 14) that receive the supply of the fixed potential from the fixed potential-use trunk line via the branch lines 22. The shift register 11 may be a single shift register or may also be a plurality of shift registers (a shift register with the odd-numbered stages and a shift register with the even-numbered stages). All of the stages included in the shift register 11 are disposed in a line in a specified direction to form an array (one-dimensional array). The number of the branch lines 22 is smaller than the number of the stages included in the array. All of the stages included in the array (m bistable circuits 14) are grouped into respective groups each having a plurality of stages (p stages) in the order of arrangement, a branch line 22 and an auxiliary line 23 are provided for each group, and an auxiliary line 23 is connected to the corresponding branch line 22 and the plurality of stages (p stages) within the corresponding group.

Figure 5:
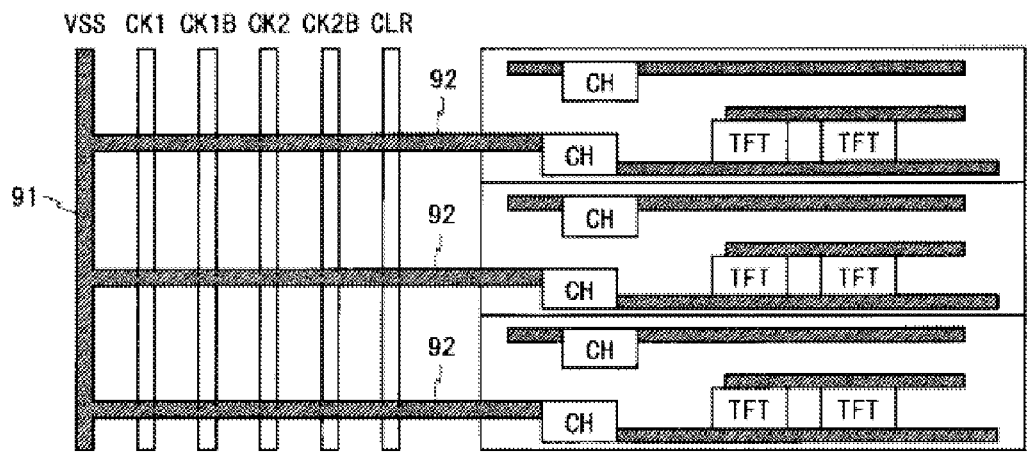
FIG. 5 is a model diagram showing the layout of a conventional scanning-signal-line driving circuit.

The effects of the scanning-signal-line driving circuit according to the present embodiment will be described below. FIG. 5 is a model diagram showing the layout of a conventional scanning-signal-line driving circuit. With the conventional scanning-signal-line driving circuit (FIG. 5), a branch line 92 connected to a trunk line 91 for VSS is provided for every single stage in the shift register in order to supply a low-level potential VSS to each of the stages in the shift register. In contrast, with the scanning-signal-line driving circuit according to the present embodiment (FIG. 4), a branch line 22 connected to the trunk line 21 for VSS is provided for every p stages included in the one-dimensional array in order to supply the low-level potential VSS to each of the stages in the shift register 11.

Accordingly, with the scanning-signal-line driving circuit according to the present embodiment, when the trunk line 21 for VSS and each of the stages in the shift register 11 are connected, it is possible to reduce the number of the branch lines and thus to decrease the frame area of the liquid crystal panel compared to the past. Moreover, as seen from FIGS. 4 and 5, overlapping of the branch lines 22 and the trunk lines 12 is reduced from the past, so it is possible to reduce the load capacitance formed at the overlap sections of the wiring lines. Consequently, the power consumption of the liquid crystal display device can be reduced by reducing unnecessary charge and discharge. In addition, the reduction in the load capacitance can reduce fluctuations in the potential of the trunk line 21 for VSS when the potentials of the clock signal-use trunk lines change, and it is possible to prevent malfunction of the scanning-signal-line driving circuit by reducing delay in the clock signals. Furthermore, as a result of the clock signal-use trunk lines included in the trunk lines 12 being made narrower with the decrease in the clock signal delay being taken into an account, the frame area of the liquid crystal panel can be reduced further.

Figure 6:
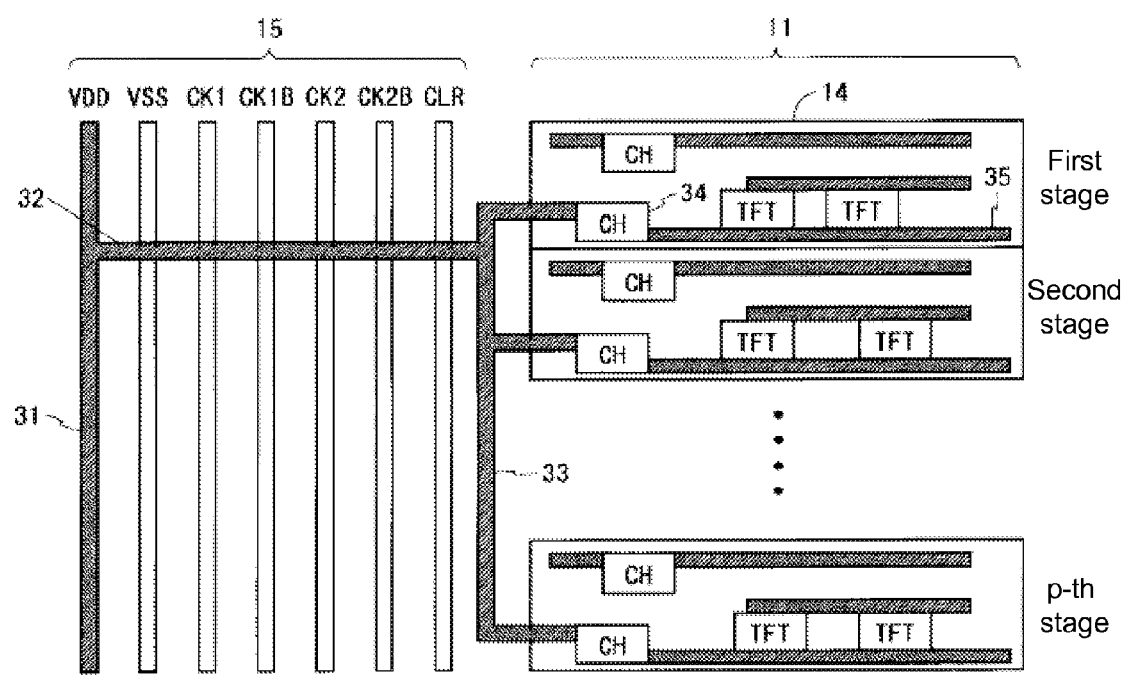
FIG. 6 is a model diagram showing the layout of the scanning-signal-line driving circuit according to a modified example of the first embodiment.

FIG. 6 is a model diagram showing the layout of the scanning-signal-line driving circuit according to a modified example of the first embodiment. In this modified example, a fixed high-level potential VDD, a fixed low-level potential VSS, four gate clock signals, and a clear signal CLR are supplied to each of the stages in the shift register 11. Trunk lines 15 include a trunk line 31 for VDD in addition to the six wiring lines included in the trunk lines 12.

The m bistable circuits 14 included in the one-dimensional array are grouped into sets of p circuits in the order of arrangement. One branch line 32 and one auxiliary line 33 are provided for each group in order to supply the high-level potential VDD to the p bistable circuits 14 within each group. The auxiliary line 33 has a first portion extending in a direction orthogonal to the branch line 32 and a second portion extending in a direction parallel to the branch line 32 (there are p second portions). The first portion is disposed on the outside of the area where the shift register 11 is disposed. One end (the right end in FIG. 6) of each of the second portions is connected to a contact 34 provided within the corresponding bistable circuit 14. The source terminals of some of the TFTs included in a bistable circuit 14 are connected to an internal wiring line 35 which is connected to the contact 34.

With the scanning-signal-line driving circuit according to this modified example, when the high-level potential VDD is supplied to each of the stages in the shift register 11 from the trunk line 31 for VDD, by using a smaller number of the branch lines 32 than in the past, it is possible to reduce the frame area of the liquid crystal panel and to decrease the power consumption of the liquid crystal display device.

Second Embodiment

Figure 7:
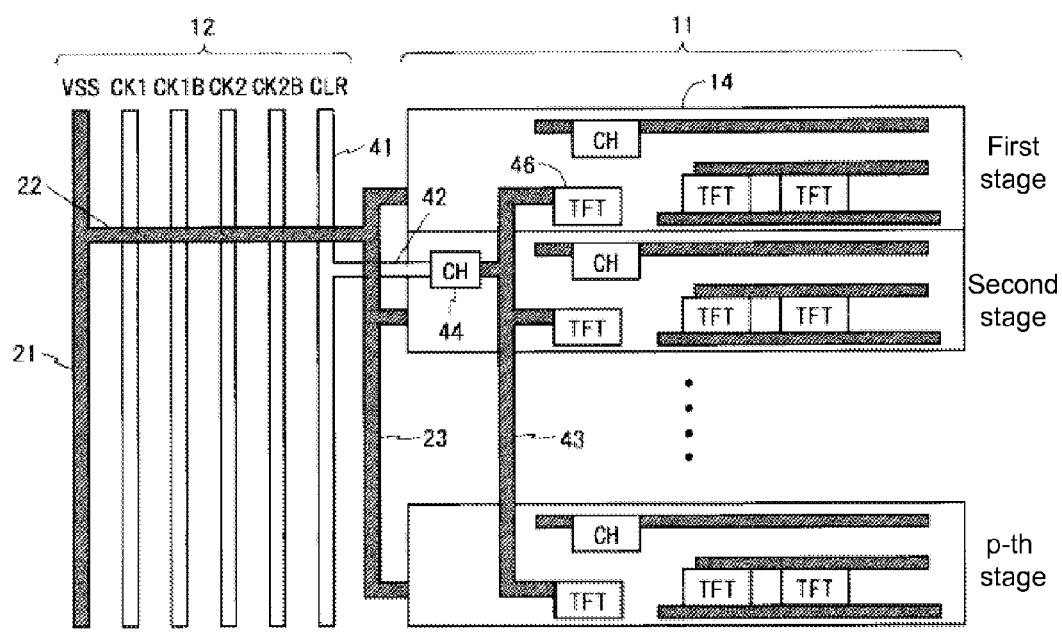
FIG. 7 is a model diagram showing the layout of the scanning-signal-line driving circuit according to a second embodiment of the present invention.

FIG. 7 is a model diagram showing the layout of the scanning-signal-line driving circuit according to a second embodiment of the present invention. In the second embodiment, the term "gate clock signal GCK" includes four gate clock signals, and the low-level potential VSS and five signals are supplied to each of the stages in the shift register 11 in the same manner as in the first embodiment. FIG. 7 describes wiring lines for supplying the low-level potential VSS and the clear signal CLR to the first to the p-th stages (p is an integer of two or more) in the shift register 11.

The m bistable circuits 14 included in the shift register 11 form a one-dimensional array by being disposed in a line in the direction of extension of the trunk lines 12. The m bistable circuits 14 included in the one-dimensional array are grouped with every p circuits in the order of arrangement. In order to supply a low-level potential VSS to the p bistable circuits 14 in each group, one branch line 22 and one auxiliary line 23 are provided for each group in the same manner as in the first embodiment. Note that parts of the auxiliary lines 23 located inside the bistable circuits 14 are omitted in FIG. 7.

In addition to these, one branch line 42 and one auxiliary line 43 are provided for each group in order to supply a clear signal CLR to the p bistable circuits 14 within each group. One end (the left end in FIG. 7) of the branch line 42 is connected to the trunk line 41 for CLR, while the other end is connected to a contact 44 provided inside one of the bistable circuits 14. The auxiliary line 43 is disposed within the area where the shift register 11 is disposed. The auxiliary line 43 has a portion extending in a direction orthogonal to the branch line 42, a portion extending in a direction parallel to the branch line 42, and a portion connected to the contact 44 (hereinafter, referred to sequentially as first to third portions; there are p second portions). One end (the left end in FIG. 7) of the third portion is connected to the contact 44. One end (the right end in FIG. 7) of each of the second portions is connected to the gate terminal of a clear signal-use TFT 46 within the corresponding bistable circuit 14.

As indicated above, the scanning-signal-line driving circuit according to the present embodiment includes the clear signal-use trunk line (trunk line 41 for CLR) for supplying the clear signal CLR and the plurality of clear signal-use branch lines (branch lines 42) connected to the clear signal-use trunk line. The number of the clear signal-use branch lines is m/p and is therefore smaller than the number of the stages included in the array (one-dimensional array).

With the scanning-signal-line driving circuit according to the present embodiment, a smaller number of the branch lines 22 is used than in the past when the low-level potential VSS is supplied to each stage of the shift register 11 from the trunk line 21 for VSS, and a smaller number of the branch lines 42 is used than in the past when the clear signal CLR is supplied to each stage of the shift register 11 from the trunk line 41 for CLR, thereby making it possible to reduce the frame area of the liquid crystal panel and to reduce the power consumption of the liquid crystal display device.

Note that in the above description, a branch line 42 and an auxiliary line 43 that propagate the clear signal CLR are provided for each group in the scanning-signal-line driving circuit according to the first embodiment (FIG. 4), but the same method may also be used in the scanning-signal-line driving circuit according to the modified example of the first embodiment (FIG. 6). Alternatively, the same method may also be used for a clock signal or a control signal other than the clear signal. However, depending on the configuration of the shift register, there may be cases in which it is sufficient to supply only a necessary signal among a plurality of clock signals supplied from outside to each of the stages included in the one-dimensional array. Because of this, with a scanning-signal-line driving circuit which includes the clock signal-use trunk line for supplying a clock signal and the plurality of clock signal-use branch lines connected to the clock signal-use trunk line, it would be sufficient if the number of the clock signal-use branch lines is smaller than the number of the stages that receive the supply of this clock signal from the clock signal-use trunk line among the stages included in the one-dimensional array.

Third Embodiment

Figure 8:
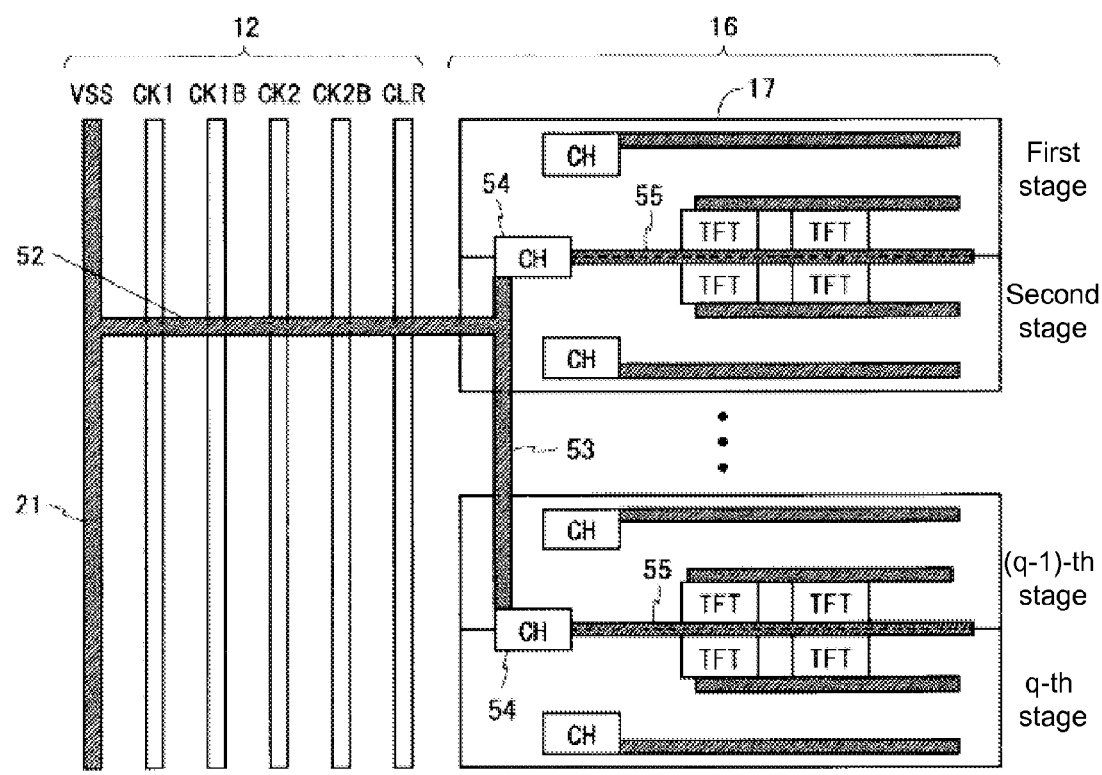
FIG. 8 is a model diagram showing the layout of the scanning-signal-line driving circuit according to a third embodiment of the present invention.

FIG. 8 is a model diagram showing the layout of the scanning-signal-line driving circuit according to a third embodiment of the present invention. In the third embodiment, the term "gate clock signal GCK" includes four gate clock signals, and a low-level potential VSS and five signals are supplied to each of the stages of a shift register 16. FIG. 8 describes wiring lines for supplying the low-level potential VSS to the first to q-th stages (q being an even number) of the shift register 16.

The m bistable circuits 17 included in the shift register 16 form a one-dimensional array by being disposed in a line in the direction of extension of the trunk lines 12. The m bistable circuits 17 included in the one-dimensional array are grouped into sets of q circuits in the order of arrangement. In order to supply the low-level potential VSS to the q bistable circuits 17 in each group, one branch line 52 and one auxiliary line 53 are provided for each group. One end (the left end in FIG. 8) of the branch line 52 is connected to the trunk line 21 for VSS. The branch line 52 extends in a direction orthogonal to the trunk line 21 for VSS. The other end (the right end in FIG. 8) of the branch line 52 is connected to the auxiliary line 53.

The m bistable circuits 17 included in the one-dimensional array are paired with two circuits each in the order of arrangement. Two bistable circuits 17 forming a pair have a layout showing line symmetry with the boundary line as the axis of symmetry if the auxiliary line 53 is ignored. A contact 54 and an internal wiring line 55 are disposed on this boundary line. One end (the left end in FIG. 8) of the internal wiring line 55 is connected to the contact 54. The contact 54 and the internal wiring line 55 are shared by the two bistable circuits 17 forming a pair. The source terminals of some of the TFTs included in the bistable circuits 17 are connected to the internal wiring line 55.

The auxiliary line 53 is disposed within the area where the shift register 16 is disposed. The auxiliary line 53 has a portion extending in a direction orthogonal to the branch line 52 and a portion for connecting to the corresponding contact 54 (not illustrated) (hereinafter, the former is referred to as a first portion, and the latter is referred to as a second portion; there are (q−4)/2 second portions). One end (the upper end in FIG. 8) of the first portion is connected to the contact 54 that is shared by the bistable circuits 17 of the first stage and second stage. The other end (the lower end in FIG. 8) of the first portion is connected to the contact 54 that is shared by the bistable circuits 17 of the (q−1)-th stage and q-th stage. Each of the second portions is connected to a contact that is shared by the corresponding two bistable circuits 17 forming a pair other than the ones described above.

As shown in FIG. 8, the layouts of the bistable circuits of the first stage, second stage, (q−1)-th stage, and q-th stage are different from each other. Moreover, bistable circuits respectively having layouts different from those of these four stages are included in the bistable circuits of the third to (q−2)-th stages as well. Thus, the one-dimensional array includes two or more stages having mutually different layouts. In addition, the one-dimensional array includes two adjacently disposed stages that share a contact 54 and an internal wiring line 55.

With the scanning-signal-line driving circuit according to the present embodiment, it is possible to reduce the frame area of the liquid crystal panel and to reduce the power consumption of the liquid crystal display device in the same manner as in the first embodiment. Furthermore, the one-dimensional array includes two or more stages having mutually different layouts. Therefore, it is possible to reduce the circuit area of the scanning-signal-line driving circuit and to reduce the frame area of the liquid crystal panel by laying out each stage of the shift register 16 with a high degree of freedom. Moreover, it is possible to reduce the circuit volume of the shift register 16 and to reduce the frame area of the liquid crystal panel by sharing an internal wiring line and a contact with two adjacently disposed stages.

Fourth Embodiment

Figure 9:
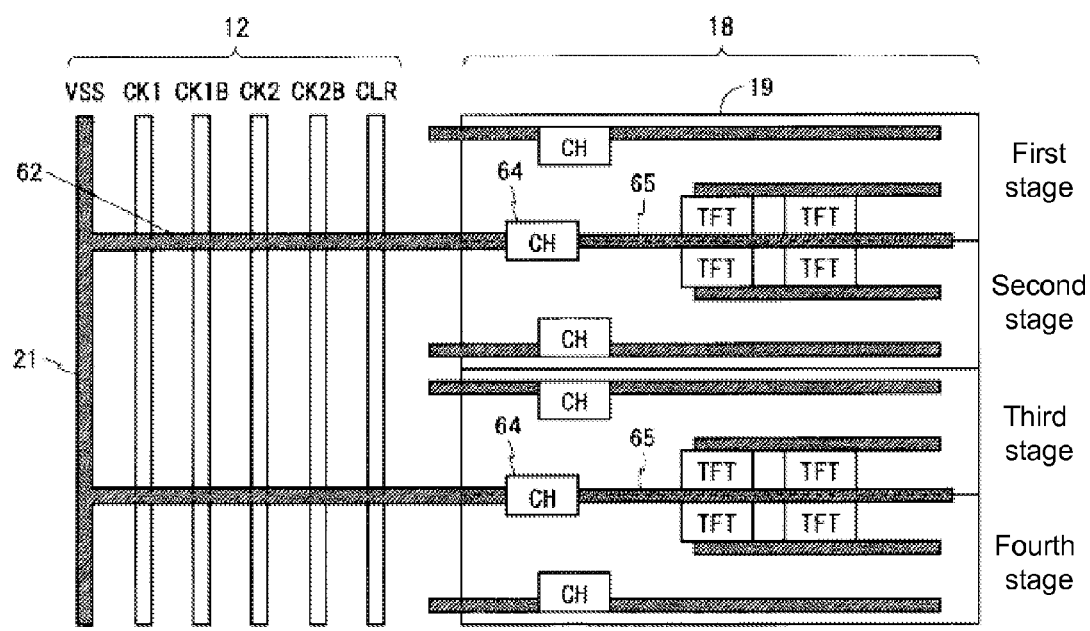
FIG. 9 is a model diagram showing the layout of the scanning-signal-line driving circuit according to a fourth embodiment of the present invention.

FIG. 9 is a model diagram showing the layout of the scanning-signal-line driving circuit according to a fourth embodiment of the present invention. In the fourth embodiment, the term "gate clock signal GCK" includes four gate clock signals, and a low-level potential VSS and five signals are supplied to each of the stages in a shift register 18 in the same manner as in the first embodiment. FIG. 9 describes wiring lines for supplying the low-level potential VSS to the first to fourth stages of the shift register 18.

The m bistable circuits 19 included in the shift register 18 form a one-dimensional array by being disposed in a line in the direction of extension of the trunk lines 12. The m bistable circuits 19 included in the one-dimensional array are paired with two circuits each in the order of arrangement. Two bistable circuits 19 forming a pair have a layout showing line symmetry with the boundary line as the axis of symmetry. A contact 64 and an internal wiring line 65 are disposed on this boundary line. One end (the left end in FIG. 9) of the internal wiring line 65 is connected to the contact 64. The contact 64 and the internal wiring line 65 are shared by the two bistable circuits 19 forming a pair. The source terminals of some of the TFTs included in the bistable circuits 19 are connected to the internal wiring line 65.

In order to supply the low-level potential VSS to the two bistable circuits 19 forming a pair, a branch line 62 is provided for every two bistable circuits 19 forming a pair. One end (the left end in FIG. 9) of the branch line 62 is connected to the trunk line 21 for VSS. The branch line 62 extends in a direction orthogonal to the trunk line 21 for VSS. The other end (the right end in FIG. 9) of the branch line 62 is connected to the contact 64 that is shared by the two bistable circuits 19 forming a pair.

With the scanning-signal-line driving circuit of the present embodiment, it is possible to reduce the frame area of the liquid crystal panel and to reduce the power consumption of the liquid crystal display device in the same manner as in the first embodiment. In addition, as a result of a branch line 62 being provided so as to correspond to two stages that are laid out in line symmetry, the low-level potential VSS can be supplied to each of the stages of the shift register from the trunk line 21 for VSS by using the branch lines 62 that are a half the number of the stages included in the one-dimensional array. Furthermore, laying out two stages in line symmetry can facilitate the layout. Moreover, sharing a wiring line and a contact by two adjacently disposed stages makes it possible to reduce the circuit volume of the shift register 18 and to reduce the frame area of the liquid crystal panel.

Fifth Embodiment

FIGS. 10A to 10E are model diagrams showing the layouts of the scanning-signal-line driving circuits according to a fifth embodiment of the present invention. In FIGS. 10A to 10E, the rectangular shapes with a dotted pattern represent trunk lines or auxiliary lines, the solid lines extending in the horizontal direction represent branch lines, and the horizontally elongated rectangular shapes represent stages (bistable circuits) in the shift register.

Figure 10A:
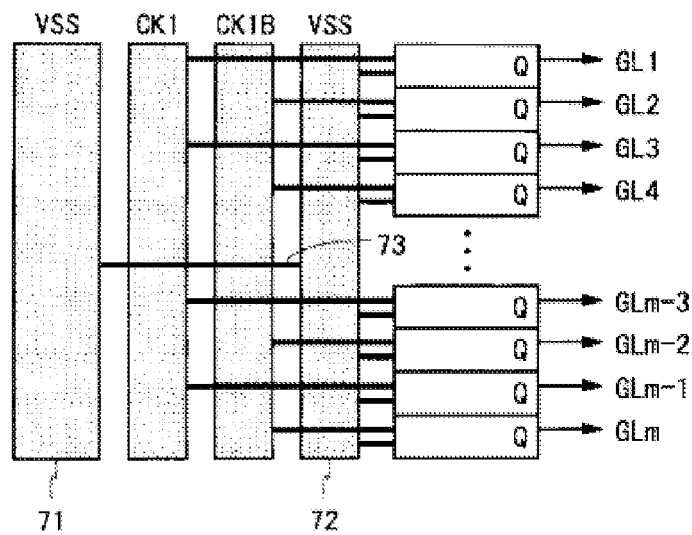
FIG. 10A is a model diagram showing the layout of the scanning-signal-line driving circuit according to a fifth embodiment (first example) of the present invention.

The scanning-signal-line driving circuit shown in FIG. 10A is provided with, in order from the left, a trunk line 71 for a low-level potential VSS, trunk lines for gate clock signals CK1 and CK1B, and an auxiliary line 72 for VSS. The auxiliary line 72 for VSS has substantially the same length as the trunk line 71 for VSS. A plurality of branch lines 73 are provided (only one line is shown in FIG. 10A) in order to connect the trunk line 71 for VSS and the auxiliary line 72 for VSS. The auxiliary line 72 for VSS is connected to all of the branch lines 73 connected to the trunk line 71 for VSS and all of the stages in the shift register.

Figure 10B:
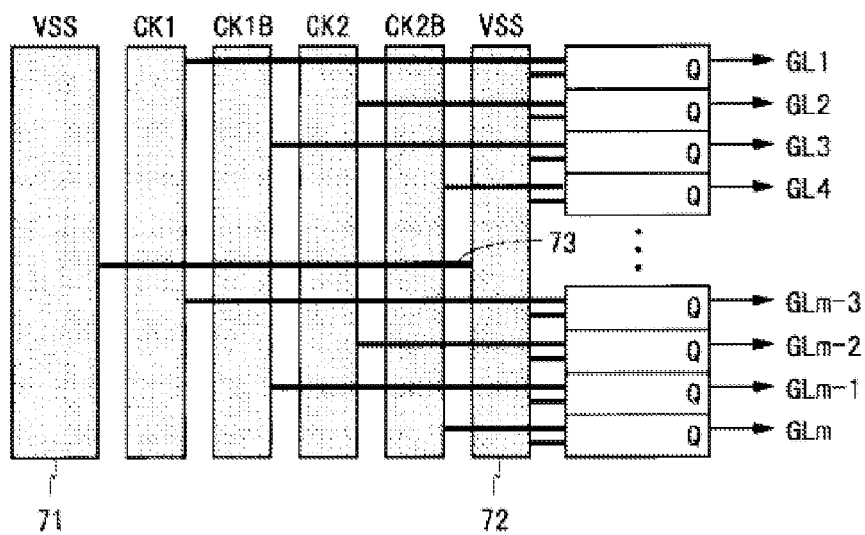
FIG. 10B is a model diagram showing the layout of the scanning-signal-line driving circuit according to the fifth embodiment (second example) of the present invention.

The scanning-signal-line driving circuit shown in FIG. 10B is provided with, in order from the left, a trunk line 71 for a low-level potential VSS, trunk lines for gate clock signals CK1, CK1B, CK2, and CK2B, and an auxiliary line 72 for VSS. The configuration is otherwise the same as in the scanning-signal-line driving circuit shown in FIG. 10A.

Figure 10C:
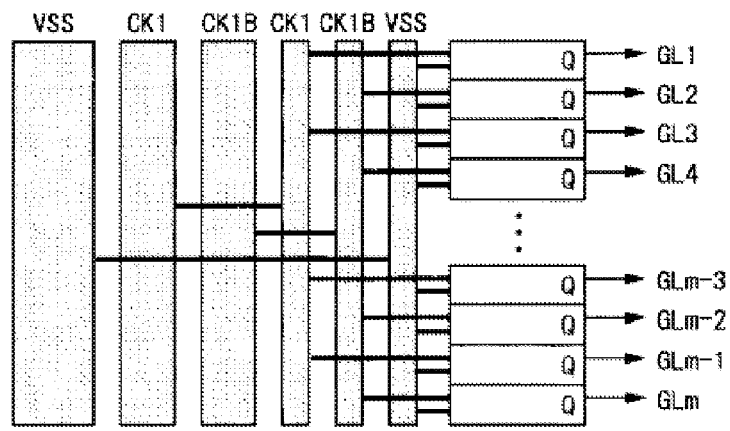
FIG. 10C is a model diagram showing the layout of the scanning-signal-line driving circuit according to the fifth embodiment (third example) of the present invention.

The scanning-signal-line driving circuit shown in FIG. 10C is provided with, in order from the left, a trunk line for a low-level potential VSS, trunk lines for gate clock signals CK1 and CK1B, auxiliary lines for the gate clock signals CK1 and CK1B, and an auxiliary line for VSS. The auxiliary lines for the two gate clock signals each have substantially the same length as the trunk line for VSS. A plurality of branch lines are provided in order to respectively connect the trunk lines for the two gate clock signals and the auxiliary lines for the two gate clock signals. The configuration is otherwise the same as in the scanning-signal-line driving circuit shown in FIG. 10A.

Figure 10D:
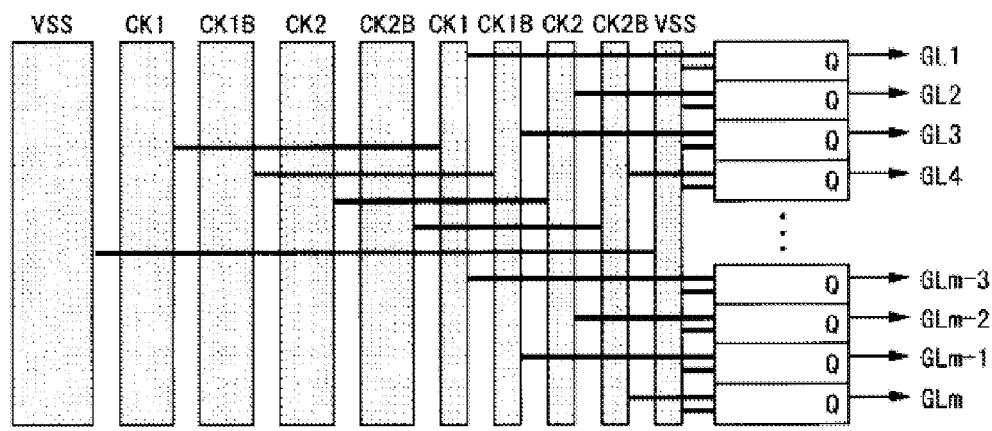
FIG. 10D is a model diagram showing the layout of the scanning-signal-line driving circuit according to the fifth embodiment (fourth example) of the present invention.

The scanning-signal-line driving circuit shown in FIG. 10D is provided with, in order from the left, a trunk line for a low-level potential VSS, trunk lines for gate clock signals CK1, CK1B, CK2, and CK2B, auxiliary lines for the gate clock signals CK1, CK1B, CK2, and CK2B, and an auxiliary line for VSS. The auxiliary lines for the four gate clock signals each have substantially the same length as the trunk line for VSS. A plurality of branch lines are provided in order to respectively connect the trunk lines for the four gate clock signals and the auxiliary lines for the four gate clock signals. The configuration is otherwise the same as in the scanning-signal-line driving circuit shown in FIG. 10A.

Figure 10E:
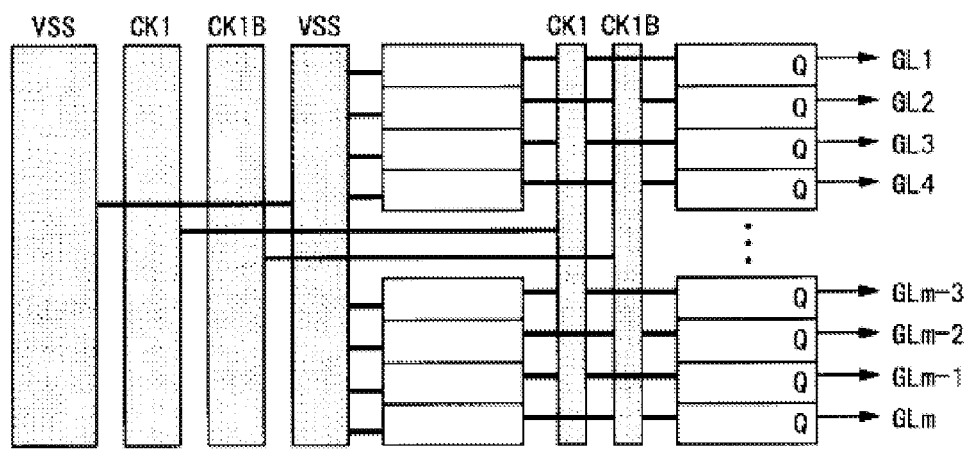
FIG. 10E is a model diagram showing the layout of the scanning-signal-line driving circuit according to the fifth embodiment (fifth example) of the present invention.

In the scanning-signal-line driving circuit shown in FIG. 10E, the respective stages (bistable circuits) in the shift register are divided into two sections. Auxiliary lines for gate clock signals CK1 and CK1B are disposed between the two divided sections. The configuration is otherwise the same as in the scanning-signal-line driving circuit shown in FIG. 10C.

Thus, in the scanning-signal-line driving circuits shown in FIGS. 10A to 10E, the auxiliary line for VSS has substantially the same length as the trunk line for VSS and is connected to all of the branch lines connected to the trunk line for VSS and all of the stages in the shift register. By providing such an auxiliary line, it is possible to supply the low-level potential VSS to each of the stages in the shift register from the trunk line for VSS, which is a fixed potential-use trunk line, by using a smaller number of the branch lines than in the past. Therefore, it is possible to reduce the frame area of the liquid crystal panel and to reduce the power consumption of the liquid crystal display device while properly supplying the potential to each of the stages in the shift register from the fixed potential-use trunk line.

In addition, each of the scanning-signal-line driving circuits shown in FIGS. 10C to 10E further includes a plurality of clock signal-use branch lines connected to the clock signal-use trunk lines and clock signal-use auxiliary lines connected to the clock signal-use branch lines and the plurality of stages in the shift register. The number of the clock signal-use branch lines is smaller than the number of the stages that receive the supply of the clock signals from the clock signal-use trunk lines among the stages included in the one-dimensional array. Therefore, the number of the clock signal-use branch lines can be reduced compared to the conventional configuration in which a clock signal-use branch line is provided for every single stage in the shift register. Accordingly, it is possible to reduce the frame area of the liquid crystal panel and to reduce the power consumption of the liquid crystal display device.

Figure 11A:
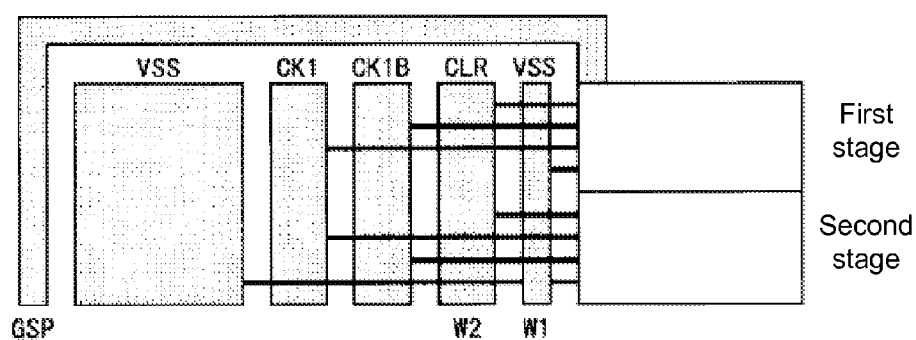
FIG. 11A is a model diagram showing the layout of the scanning-signal-line driving circuit according to an embodiment of the present invention.
Figure 11B:
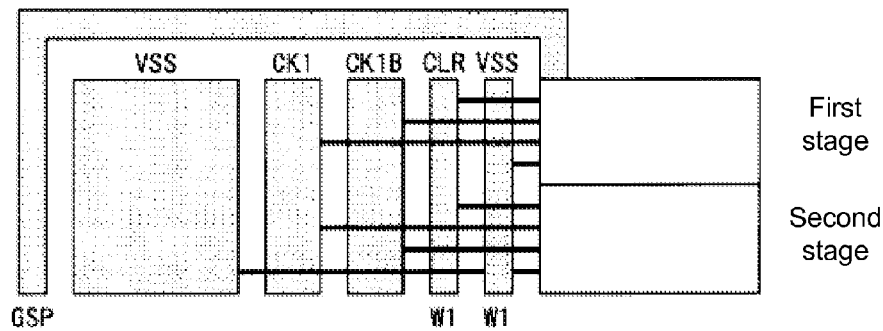
FIG. 11B is a model diagram showing the layout of the scanning-signal-line driving circuit according to an embodiment of the present invention.
Figure 11C:
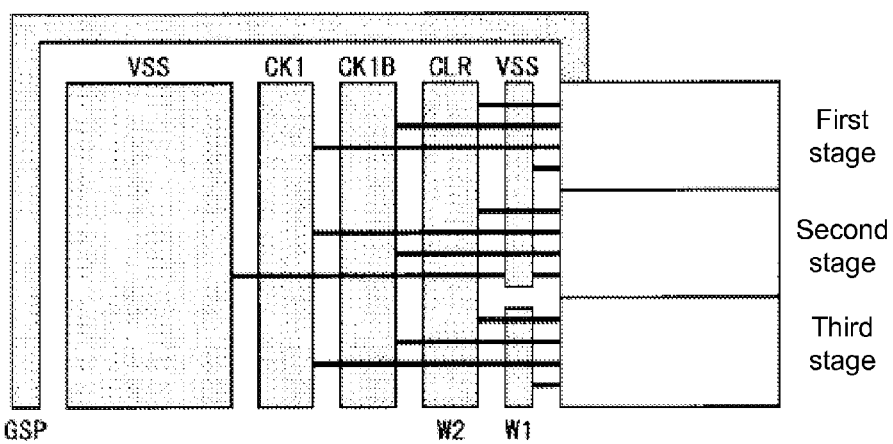
FIG. 11C is a model diagram showing the layout of the scanning-signal-line driving circuit according to an embodiment of the present invention.
Figure 11D:
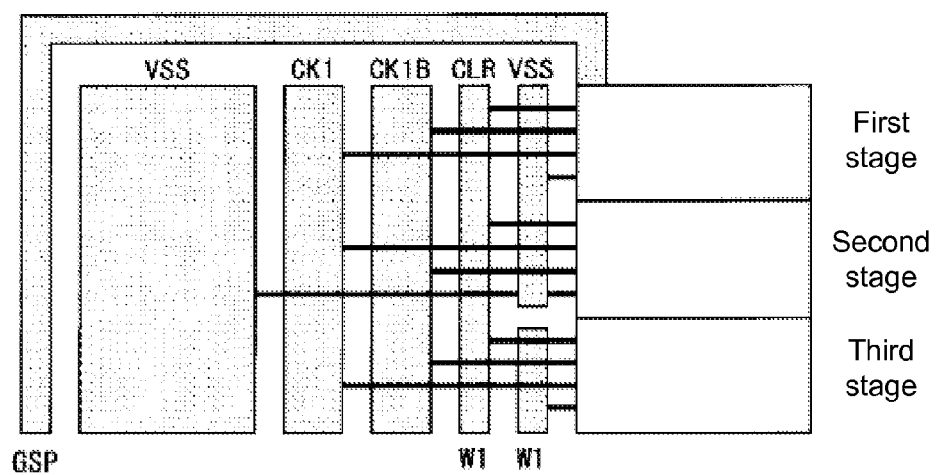
FIG. 11D is a model diagram showing the layout of the scanning-signal-line driving circuit according to an embodiment of the present invention.

Note that in the scanning-signal-line driving circuits according to the first, second, and fifth embodiments, it is preferable that the auxiliary lines be narrower than the fixed potential-use trunk line. In the scanning-signal-line driving circuits shown in FIGS. 11A to 11D, for example, an auxiliary line for VSS is narrower than a trunk line for VSS. The auxiliary line for VSS shown in FIG. 11A is narrower than an adjacent trunk line for CLR and is connected to all of the stages in the shift register. The auxiliary line for VSS shown in FIG. 11B has the same width as an adjacent trunk line for CLR and is connected to all of the stages in the shift register. The auxiliary line for VSS shown in FIG. 11C is narrower than an adjacent trunk line for CLR and is connected to some of the stages (here, two stages) in the shift register. The auxiliary line for VSS shown in FIG. 11D has the same width as an adjacent trunk line for CLR and is connected to some of the stages (here, two stages) in the shift register. The load capacitance formed at the overlap sections of the auxiliary line and other wiring lines can be reduced by making the auxiliary line narrower. Therefore, it is possible to reduce the power consumption of the liquid crystal display device and to prevent malfunction of the scanning-signal-line driving circuit by reducing clock signal delay.

Furthermore, the auxiliary line 23 shown in FIG. 4 is disposed on the outside of the area where the shift register 11 is disposed, and the auxiliary line 43 shown in FIG. 7 is disposed within the area where the shift register 11 is disposed. Thus, the auxiliary lines may be disposed on the outside of the area where the shift register is disposed or may also be disposed within the area where the shift register is disposed. However, the former can be realized more easily.

Moreover, the third and fourth embodiments are designed such that two adjacently disposed stages share a wiring line and a contact. In general, it is sufficient if two adjacently disposed stages share at least one of a wiring line, a contact, and a switching element. In addition, with regard to the second to fifth embodiments, it would also be possible to configure modified examples similar to that of the first embodiment and to supply a high-level potential VDD to each of the stages in the shift register in the same method as in the second to fifth embodiments.

Furthermore, the trunk lines, the branch lines, and the auxiliary lines are provided on specified wiring layers in FIGS. 4 and 6 to 11D, but as long as intersecting wiring lines are provided on different wiring layers, the respective types of wiring line may be provided on any wiring layers. For instance, in FIG. 4, the trunk line 21 for VSS and the clock signal-use trunk lines included in the trunk lines 12 are provided on different wiring layers, but the trunk line 21 for VSS and the clock signal-use trunk lines may also be provided on the same wiring layer.

Figure 12:
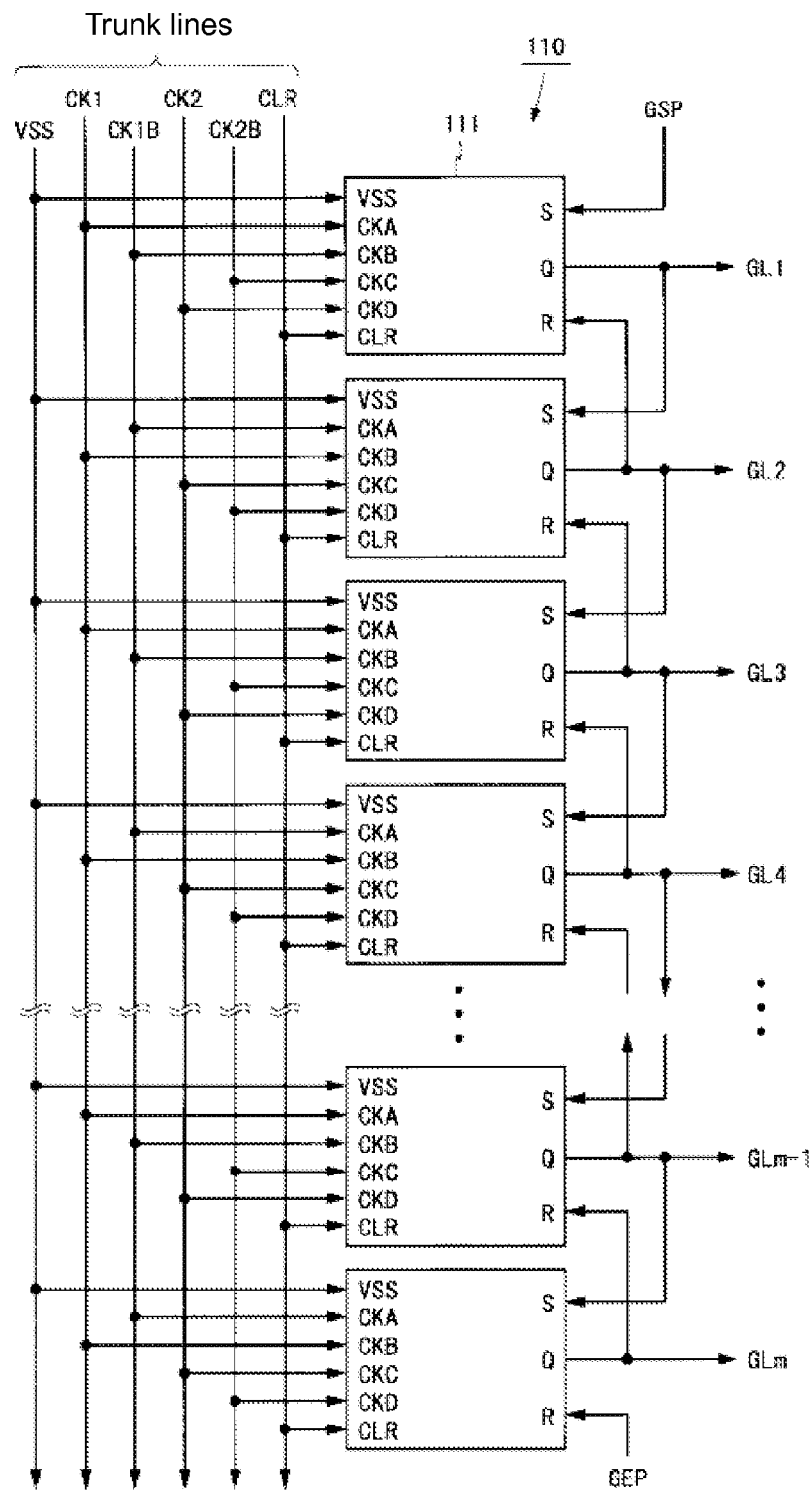
FIG. 12 is a block diagram of a scanning-signal-line driving circuit (first example) to which the present invention can be applied.

The present invention can be applied to various types of scanning-signal-line driving circuit. Concrete examples of a scanning-signal-line driving circuit to which the present invention can be applied will be described below. FIG. 12 is a block diagram of the scanning-signal-line driving circuit according to a first example. The scanning-signal-line driving circuit 110 shown in FIG. 12 includes a shift register including m bistable circuits 111 and trunk lines. The trunk lines include six wiring lines (a trunk line for a low-level potential VSS, trunk lines for gate clock signals CK1, CK1B, CK2, and CK2B, and a trunk line for a clear signal CLR). In the first example, the present invention can be applied to the supply of the low-level potential VSS.

The following fixed potential and signals are input to the bistable circuits 111 included in the scanning-signal-line driving circuit 110. The low-level potential VSS and the clear signal CLR are input to the bistable circuits of all the stages. The gate clock signals CK1, CK1B, CK2B, and CK2 are respectively input as clocks CKA, CKB, CKC, and CKD to the bistable circuits of the odd-numbered stages. The gate clock signals CK1B, CK1, CK2, and CK2B are respectively input as clocks CKA, CKB, CKC, and CKD to the bistable circuits of the even-numbered stages. A gate start pulse signal GSP is input as a set signal S to the bistable circuit of the first stage. A state signal Q that is output from the bistable circuit of the previous stage is input as the set signal S to the bistable circuit other than that of the first stage. A gate end pulse signal GEP is input as a reset signal R to the bistable circuit of the m-th stage. A state signal Q that is output from the bistable circuit of the next stage is input as the reset signal R to the bistable circuit other than that of the m-th stage.

Figure 13:
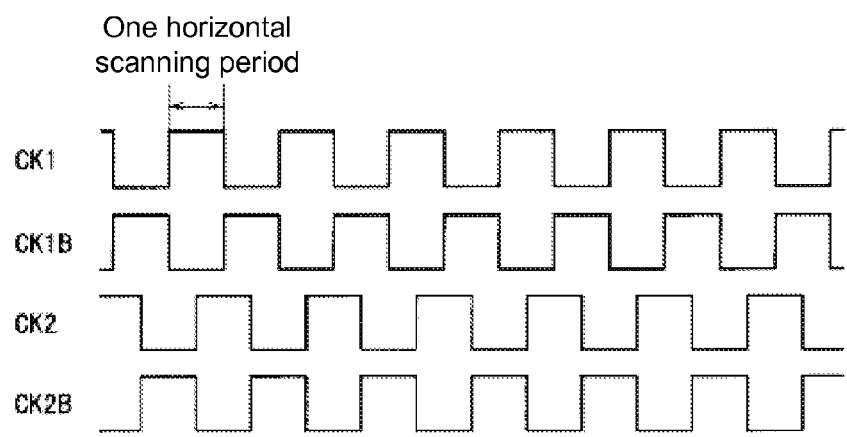
FIG. 13 is a timing chart of the gate clock signals that are input to the scanning-signal-line driving circuit shown in FIG. 12.

FIG. 13 is a timing chart of the gate clock signals that are input to the scanning-signal-line driving circuit 110. As shown in FIG. 13, the potential of each of the gate clock signals CK1, CK1B, CK2, and Ck2B becomes a high level every other one of the horizontal scanning periods. The phases of the gate clock signals CK1 and CK1B are shifted by 180 degrees (corresponding to one horizontal scanning period) from each other, and the phases of the gate clock signals CK2 and CK2B are also shifted by 180 degrees from each other. The phase of the gate clock signal CK2 is delayed by 90 degrees from the phase of the gate clock signal CK1.

Figure 14:
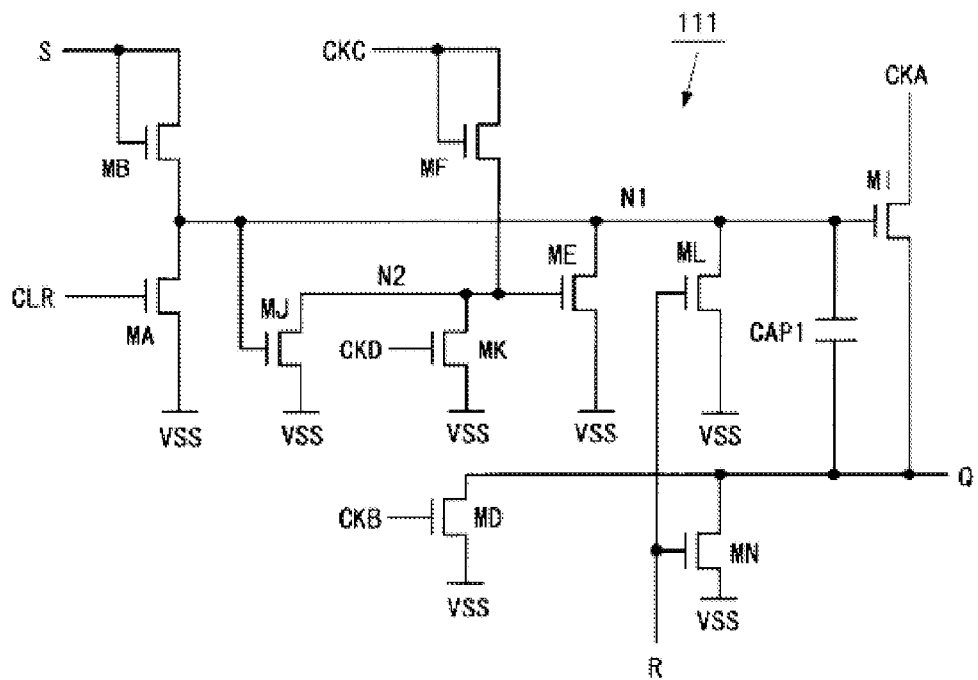
FIG. 14 is a circuit diagram of a bistable circuit included in the scanning-signal-line driving circuit shown in FIG. 12.

FIG. 14 is a circuit diagram of a bistable circuit 111. The bistable circuit 111 includes a capacitor CAP1 and 10 TFTs: MA, MB, MI, MF, MJ, MK, ME, ML, MN, and MD as shown in FIG. 14. The source terminal of the TFT MB, the drain terminals of the TFTs MA, ME, and ML, the gate terminals of the TFTs MJ and MI, and one end of the capacitor CAP1 are connected to the same node (hereinafter referred to as node N1). The drain terminals of the TFTs MJ and MK, the source terminal of the TFT MF, and the gate terminal of the TFT ME are connected to the same node (hereinafter referred to as node N2).

The TFT MA sets the potential of the node N1 at a low level while the clear signal CLR is at a high level. The TFT MB sets the potential of the node N1 at a high level while the set signal S is at a high level. The TFT MI supplies the potential of the clock CKA to the output terminal Q while the potential of the node N1 is at a high level. The TFT MF sets the potential of the node N2 at a high level while the clock CKC is at a high level.

The TFT MJ sets the potential of the node N2 at a low level while the potential of the node N1 is at a high level. If the potential of the node N2 becomes a high level during the selection period of the corresponding scanning signal line, the TFT ME is placed in an ON state, the potential of the node N1 is lowered, and the TFT MI is placed in an OFF state. The TFT MJ is provided in order to prevent this phenomenon.

The TFT MK sets the potential of the node N2 at a low level while the clock CKD is at a high level. If the TFT MK is not provided, the potential of the node N2 is always at a high level, except during the selection period of the corresponding scanning signal line, and a bias voltage is continued to be applied to the TFT ME. If this state is continued, the threshold voltage of the TFT ME is increased, and the TFT ME no longer functions sufficiently as the switching element. The TFT MK is provided in order to prevent this phenomenon.

The TFT ME sets the potential of the node N1 at a low level while the potential of the node N2 is at a high level. The TFT ML sets the potential of the node N1 at a low level while the reset signal R is at a high level. The TFT MN sets the potential of the output terminal Q at a low level while the reset signal R is at a high level. The TFT MD sets the potential of the output terminal Q at a low level while the clock CKB is at a high level. The capacitor CAP1 functions as an auxiliary capacitor that maintains the potential of the node N1 at a high level during the selection period of the corresponding scanning signal line.

Figure 15:
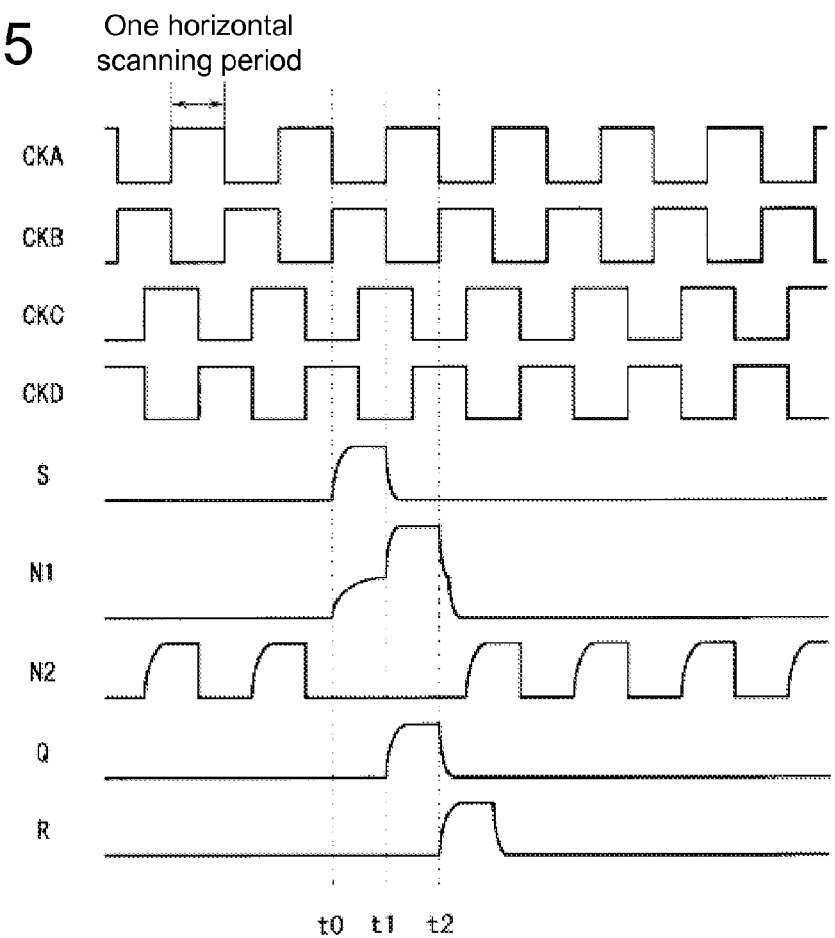
FIG. 15 is a timing chart showing the changes in the potentials in the bistable circuit shown in FIG. 14.

FIG. 15 is a timing chart showing the changes in the potentials in the bistable circuit 111. The clocks CKA, CKB, CKC, and CKD that are input to the bistable circuit 111 change as shown in FIG. 15. At time t0, the set signal S changes to a high level. Because the TFT MB is diode-connected, when the set signal S becomes a high level, the node N1 is precharged to a high level. At this point, the TFT MJ is placed in an ON state, so the potential of the node N2 becomes a low level. Furthermore, the reset signal R at this point is at a low level. Therefore, the TFTs ME and ML are in an OFF state. Accordingly, the potential of the precharged node N1 maintains a high level until time t2, which will be described later.

At time t1, the clock CKA changes from a low level to a high level. The clock CKA is supplied to the source terminal (this terminal may also be called the drain terminal) of the TFT MI, and there is a parasitic capacitor (not illustrated) between the gate and source of the TFT MI. Therefore, when the source potential of the TFT MI is increased, the gate potential of the TFT MI is also increased (that is, the node N1 is bootstrapped). As a result, the TFT MI is placed in a state in which a sufficiently high voltage is applied to the gate terminal (in an ON state). The clock CKA is at a high level during time t1 to time t2, so the state signal Q also becomes a high level during the same period. Consequently, a state is created in which the scanning signal line connected to the output terminal Q is selected, and accordingly, video signals are written to the pixel capacitors in the plurality of pixel circuits connected to this scanning signal line.

At time t2, the clock CKA changes from a high level to a low level, and the clock CKB and the reset signal R change from a low level to a high level. Consequently, the TFTs MD, ML, and MN are placed in an ON state. When the TFTs MD and MN are placed in an ON state, the state signal Q becomes a low level. When the TFT ML is placed in an ON state, the potential of the node N1 becomes a low level. As a result, the state signal Q becomes a high level between the time when the set signal S becomes a high level and the time when the reset signal R becomes a high level and while the clock CKA is at a high level.

Note that the bistable circuit 111 shown in FIG. 15 may also include a capacitor between the input terminal for the clock CKC and the node N2 in place of the TFT MF. Moreover, the bistable circuit 111 may also include multigate transistors as the TFTs ME and ML (or TFTs ME, ML, and MB) in order to prevent fluctuations in the potential of the node N1.

Figure 16:
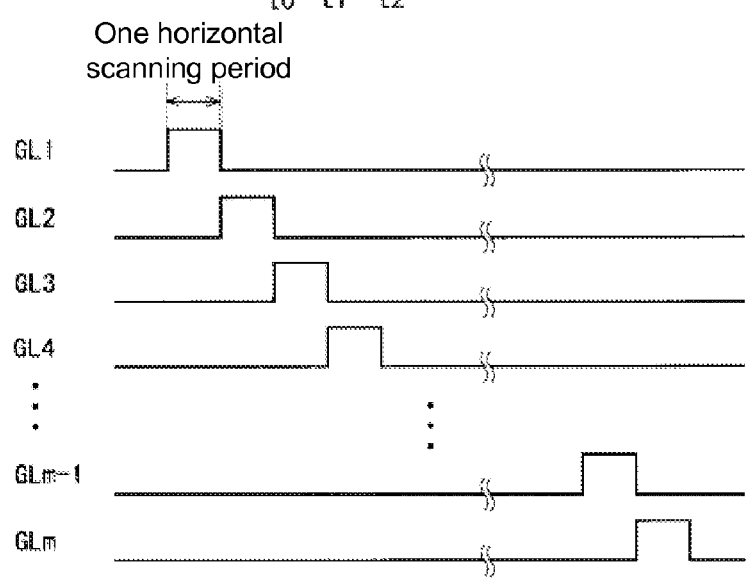
FIG. 16 is a timing chart of output signals of the scanning-signal-line driving circuit shown in FIG. 12.

The four-phase gate clock signals shown in FIG. 13 are supplied to the scanning-signal-line driving circuit 110, and the gate start pulse signal GSP and the gate end pulse signal GEP are controlled so as to be at a high level with specified timing only for one horizontal scanning period. Consequently, the pulse that is input to the bistable circuit of the first stage is transferred in sequence to the bistable circuit of the m-th stage. At this point, the potentials of the scanning signal lines GL1 to GLm sequentially become a high level for one horizontal scanning period at a time (see FIG. 16).

Figure 17:
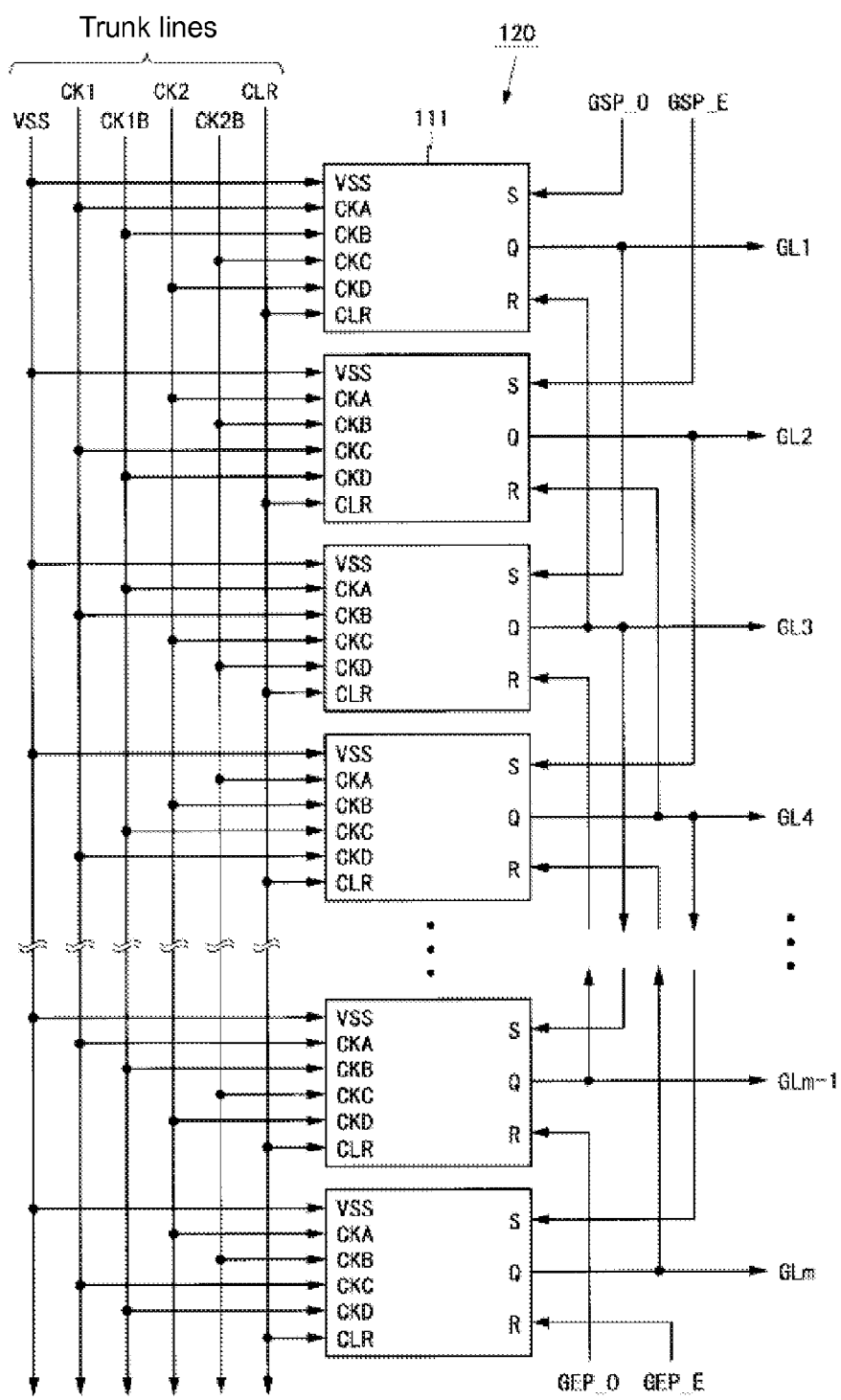
FIG. 17 is a block diagram of a scanning-signal-line driving circuit (second example) to which the present invention can be applied.

FIG. 17 is a block diagram of the scanning-signal-line driving circuit according to a second example. The scanning-signal-line driving circuit 120 shown in FIG. 17 includes a shift register with odd-numbered stages containing m/2 bistable circuits 111, a shift register with even-numbered stages containing m/2 bistable circuits 111, and trunk lines. The trunk lines include six wiring lines in the same manner as in the first example. In the second example, the present invention can be applied to the supply of a low-level potential VSS.

The following fixed potential and signals are input to the bistable circuits 111 included in the scanning-signal-line driving circuit 120. The low-level potential VSS and a clear signal CLR are input to the bistable circuits of all the stages. The gate clock signals CK1, CK1B, CK2B, and CK2 are input as the clocks CKA, CKB, CKC, and CKD, respectively to the bistable circuits of the (4k−3)-th stages when k is an integer from one to a specified number. The gate clock signals CK2, CK2B, CK1, and CK1B are respectively input as clocks CKA, CKB, CKC, and CKD to the bistable circuits of the (4k−2)-th stages. The gate clock signals CK1B, CK1, CK2, and CK2B are respectively input as clocks CKA, CKB, CKC, and CKD to the bistable circuits of the (4k−1)-th stages. The gate clock signals CK2B, CK2, CK1B, and CK1 are respectively input as clocks CKA, CKB, CKC, and CKD to the bistable circuits of the 4k-th stages.

A first gate start pulse signal GSP_O is input as the set signal S to the bistable circuit of the first stage. A second gate start pulse signal GSP_E is input as the set signal S to the bistable circuit of the second stage. The state signal Q that is output from the bistable circuit of the stage two stages previous is input as the set signal S to each of the bistable circuits other than those of the first and second stages. A first gate end pulse signal GEP_O is input as the reset signal to the bistable circuit of the (m−1)-th stage. A second gate end pulse signal GEP_E is input as the reset signal R to the bistable circuit of the m-th stage. The state signal Q that is output from the bistable circuit of the stage two stages subsequent is input as the reset signal R to the bistable circuit other than those of the (m−1)-th and m-th stages.

Figure 18:
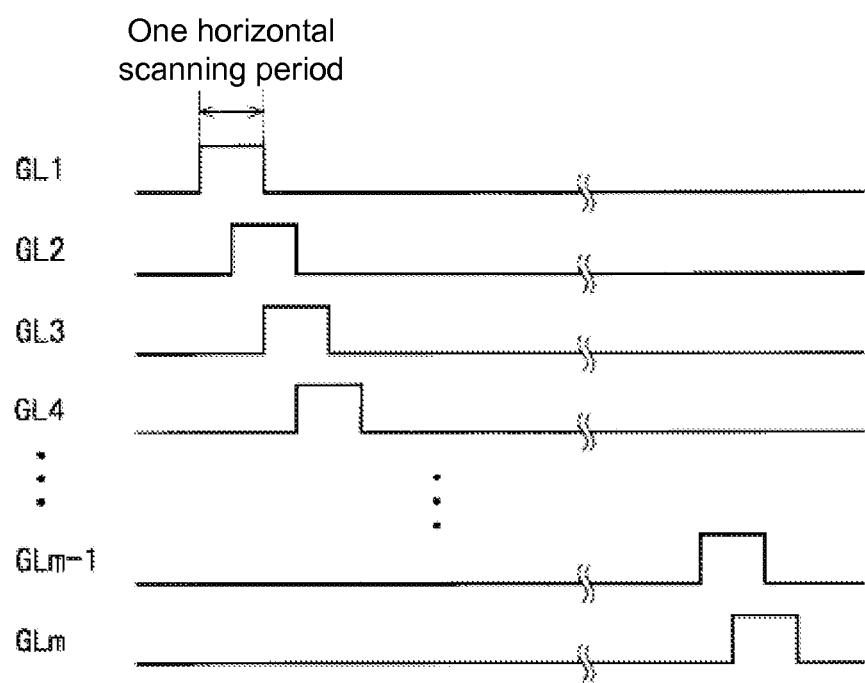
FIG. 18 is a timing chart of output signals of the scanning-signal-line driving circuit shown in FIG. 17.

The four-phase gate clock signals shown in FIG. 13 are supplied to the scanning-signal-line driving circuit 120, and the first and second gate start pulse signals GSP_O and GSP_E and the first and second gate end pulse signals GEP_O and GEP_E are controlled so as to be at a high level with specified timing only for one horizontal scanning period. Consequently, the pulse that is input to the bistable circuit of the first stage is transferred in sequence to the bistable circuit of the (m−1)-th stage, and the pulse that is input to the bistable circuit of the second stage is transferred in sequence to the bistable circuit of the m-th stage. At this time, the potentials of the scanning signal lines GL1 to GLm sequentially become a high level for one horizontal scanning period at a time with each delaying by a ½ horizontal scanning period (see FIG. 18).

Figure 19:
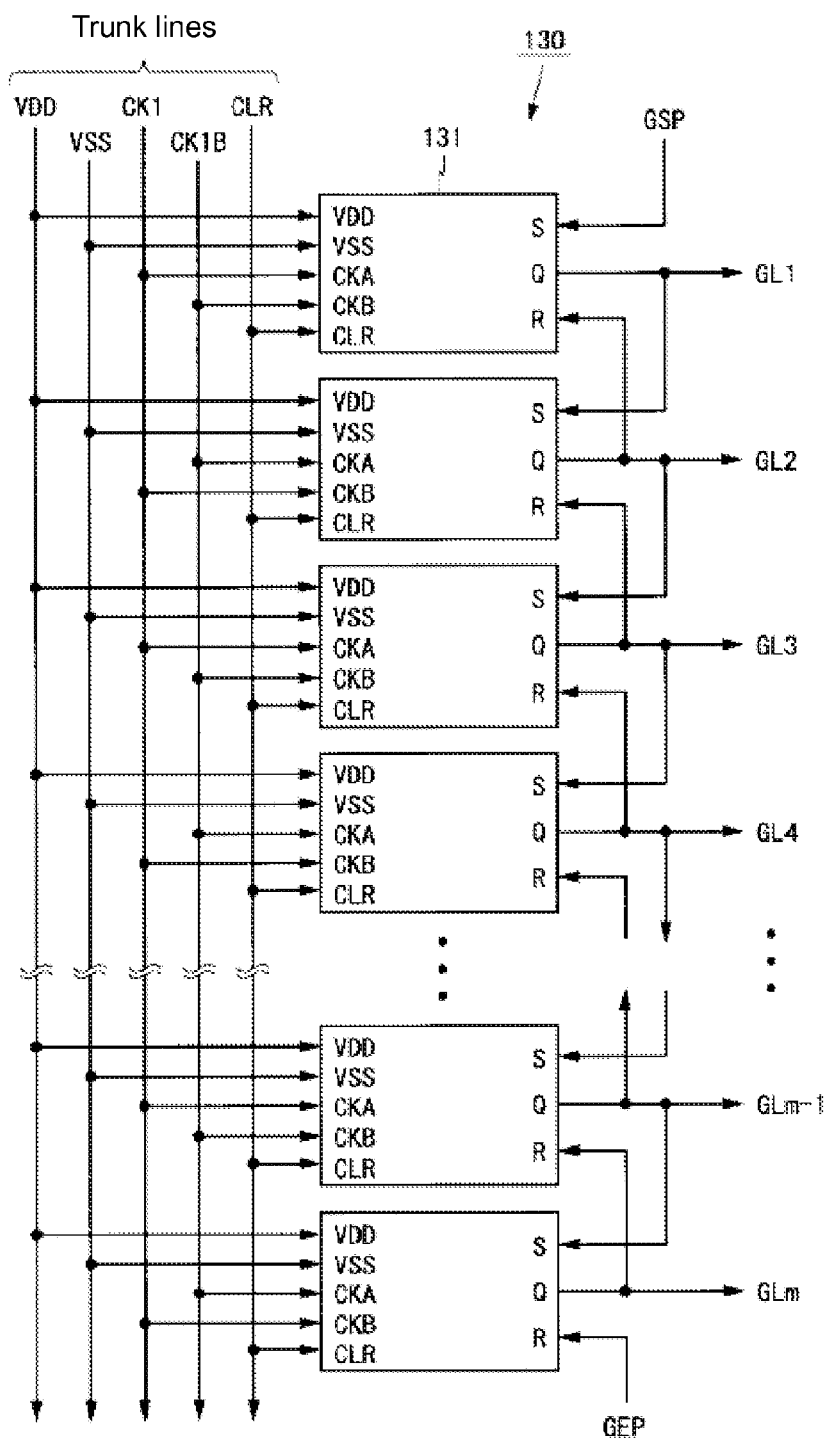
FIG. 19 is a block diagram of a scanning-signal-line driving circuit (third example) to which the present invention can be applied.

FIG. 19 is a block diagram showing details of the scanning-signal-line driving circuit according to a third example. The scanning-signal-line driving circuit 130 shown in FIG. 19 includes a shift register including m bistable circuits 131 and trunk lines. The trunk lines include five wiring lines (a trunk line for a high-level potential VDD, a trunk line for a low-level potential VSS, trunk lines for gate clock signals CK1 and CK1B, and a trunk line for a clear signal CLR). In the third example, the present invention can be applied to the supply of the high-level potential VDD and the supply of the low-level potential VSS.

The following fixed potentials and signals are input to the bistable circuits 131 included in the scanning-signal-line driving circuit 130. The high-level potential VDD, the low-level potential VSS, and the clear signal CLR are input to the bistable circuits of all the stages. The gate clock signals CK1 and CK1B are input as the clocks CKA and CKB, respectively to the bistable circuits of the odd-numbered stages. The gate clock signals CK1B and CK1 are input as the clocks CKA and CKB, respectively to the bistable circuits of the even-numbered stages. The set signals S and the reset signals R that are the same as in the first example are input to the bistable circuits 131 of the respective stages.

Figure 20:
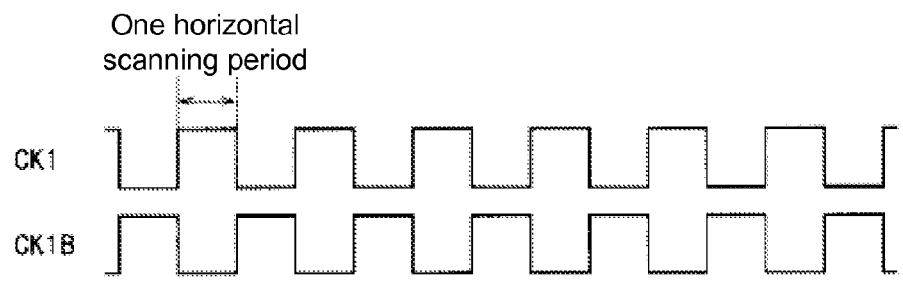
FIG. 20 is a timing chart of the gate clock signals that are input to the scanning-signal-line driving circuit shown in FIG. 19.

FIG. 20 is a timing chart of the gate clock signals that are input to the scanning-signal-line driving circuit 130. As shown in FIG. 20, the potential of each of the gate clock signals CK1 and CK1B becomes a high level every other one of the horizontal scanning periods. The phases of the gate clock signals CK1 and CK1B are shifted from each other by 180 degrees (corresponding to one horizontal scanning period).

Figure 21:
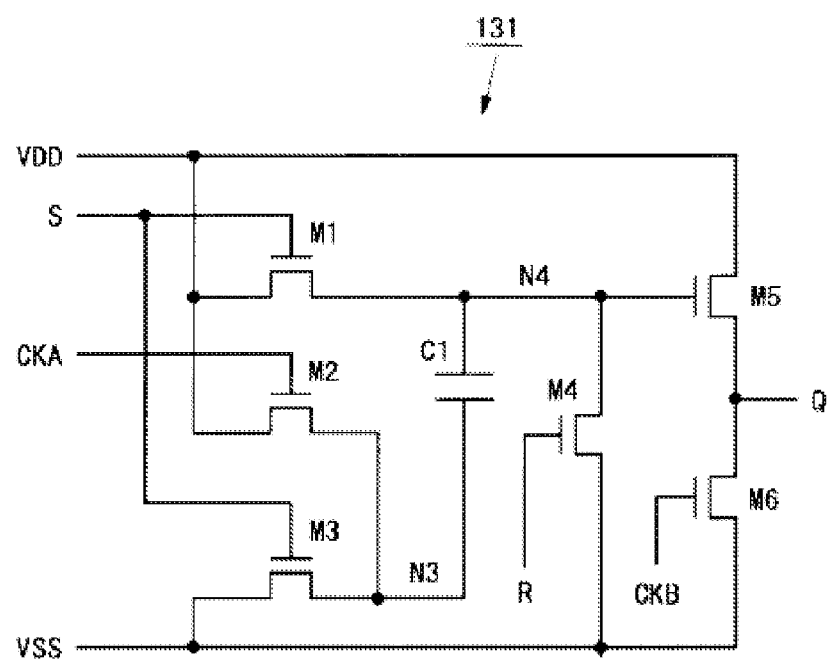
FIG. 21 is a circuit diagram of a bistable circuit included in the scanning-signal-line driving circuit shown in FIG. 19.

FIG. 21 is a circuit diagram of a bistable circuit 131. Each bistable circuit 131 includes six TFTs M1 to M6 and a capacitor C1 as shown in FIG. 21. The drain terminal of the TFT M3, the source terminal of the TFT M2, and one end of the capacitor C1 are connected to the same node (hereinafter referred to as node N3). The source terminal of the TFT M1, the drain terminal of the TFT M4, the gate terminal of the TFT M5, and the other end of the capacitor C1 are connected to the same node (hereinafter referred to as node N4).

The TFT M1 sets the potential of the node N4 at a high level while the set signal S is at a high level. The TFT M2 sets the potential of the node N3 at a high level while the clock CKA is at a high level. The TFT M3 sets the potential of the node N3 at a low level while the set signal S is at a high level. The TFT M4 sets the potential of the node N4 at a low level while the reset signal R is at a high level. The TFT M5 sets the potential of the output terminal Q at a high level while the potential of the node N4 is at a high level. The TFT M6 sets the potential of the output terminal Q at a low level while the clock CKB is at a high level.

Figure 22:
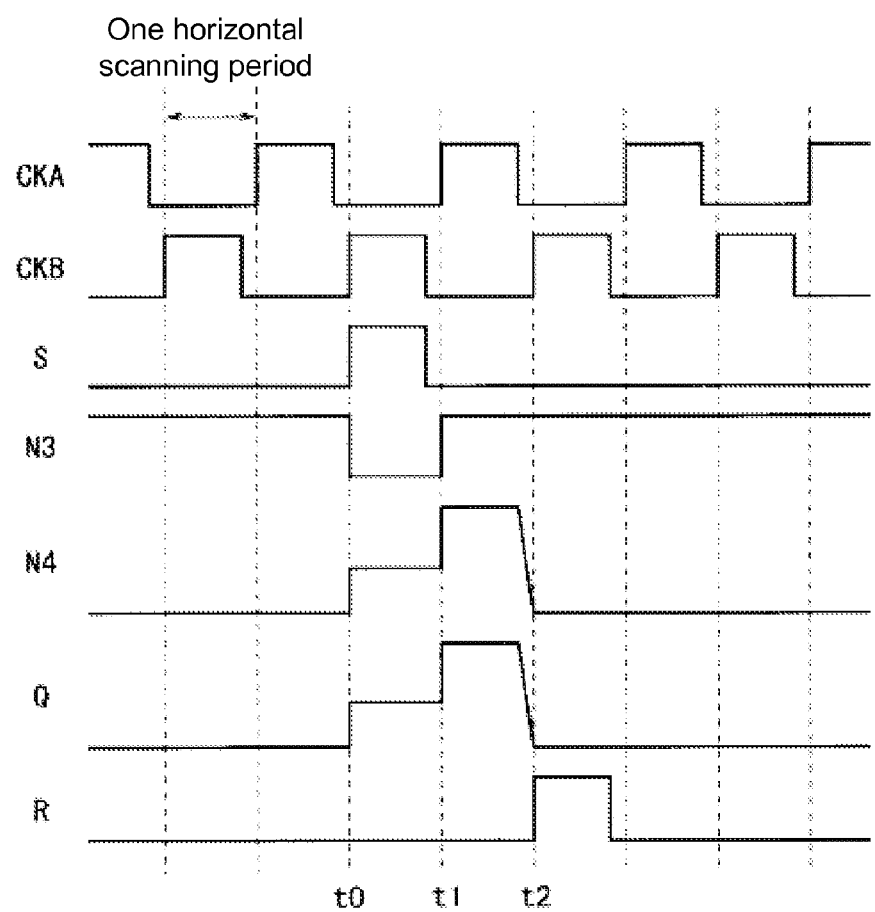
FIG. 22 is a timing chart showing the changes in the potentials in the bistable circuit shown in FIG. 21.

FIG. 22 is a timing chart showing the changes in the potentials in the bistable circuit 131. The clocks CKA and CKB that are input to the bistable circuit 131 change as shown in FIG. 22. At time t0, the set signal S changes to a high level. At this point, the TFTs M1 and M3 are placed in an ON state. Therefore, the potential of the node N4 is precharged to a high level, and the potential of the node N3 becomes a low level. The reset signal R at this point is at a low level. Therefore, the TFT M4 is in an OFF state. Accordingly, the precharged potential of the node N4 maintains at a high level until time t2, which will be described later.

At time t1, the clock CKA changes from a low level to a high level. At this point, the TFT M2 is placed in an ON state, and the potential of the node N3 becomes a high level. As the potential of the node N3 is increased due to the effect of the capacitor C1 provided between the nodes N3 and N4, the potential of the node N4 is also increased (that is, the node N4 is bootstrapped). As a result, the TFT M5 is placed in a state in which a sufficiently high voltage is applied to the gate terminal (in an ON state). During time t0 to time t2, the state signal Q changes in the same manner as the potential of the node N4 and becomes a high level. Consequently, a state is created in which the scanning signal line connected to the output terminal Q is selected, and writing of video signals to the pixel capacitors is performed in the plurality of pixel circuits connected to this scanning signal line.

At time t2, the clock CKB and the reset signal R change from a low level to a high level. Consequently, the TFTs M4 and M6 are placed in an ON state. When the TFT M6 is placed in an ON state, the state signal Q becomes a low level. When the TFT M4 is placed in an ON state, the potential of the node N4 becomes a low level. As a result, between the time when the set signal S becomes a high level and the time when the reset signal R becomes a high level, the state signal Q is at a first high level while the clock CKA is at a low level and is at a second high level which is higher than the first high level while the clock CKA is at a high level.

The two-phase gate clock signals shown in FIG. 20 are supplied to the scanning-signal-line driving circuit 130, and the gate start pulse signal GSP and the gate end pulse signal GEP are controlled so as to be at a high level with specified timing only for one horizontal scanning period. Consequently, the pulse that is input to the bistable circuit of the first stage is transferred sequentially to the bistable circuit of the m-th stage. At this time, the potentials of the scanning signal lines GL1 to GLm become a high level sequentially for one horizontal scanning period at a time in the same manner as in the first example (see FIG. 16).

Figure 23:
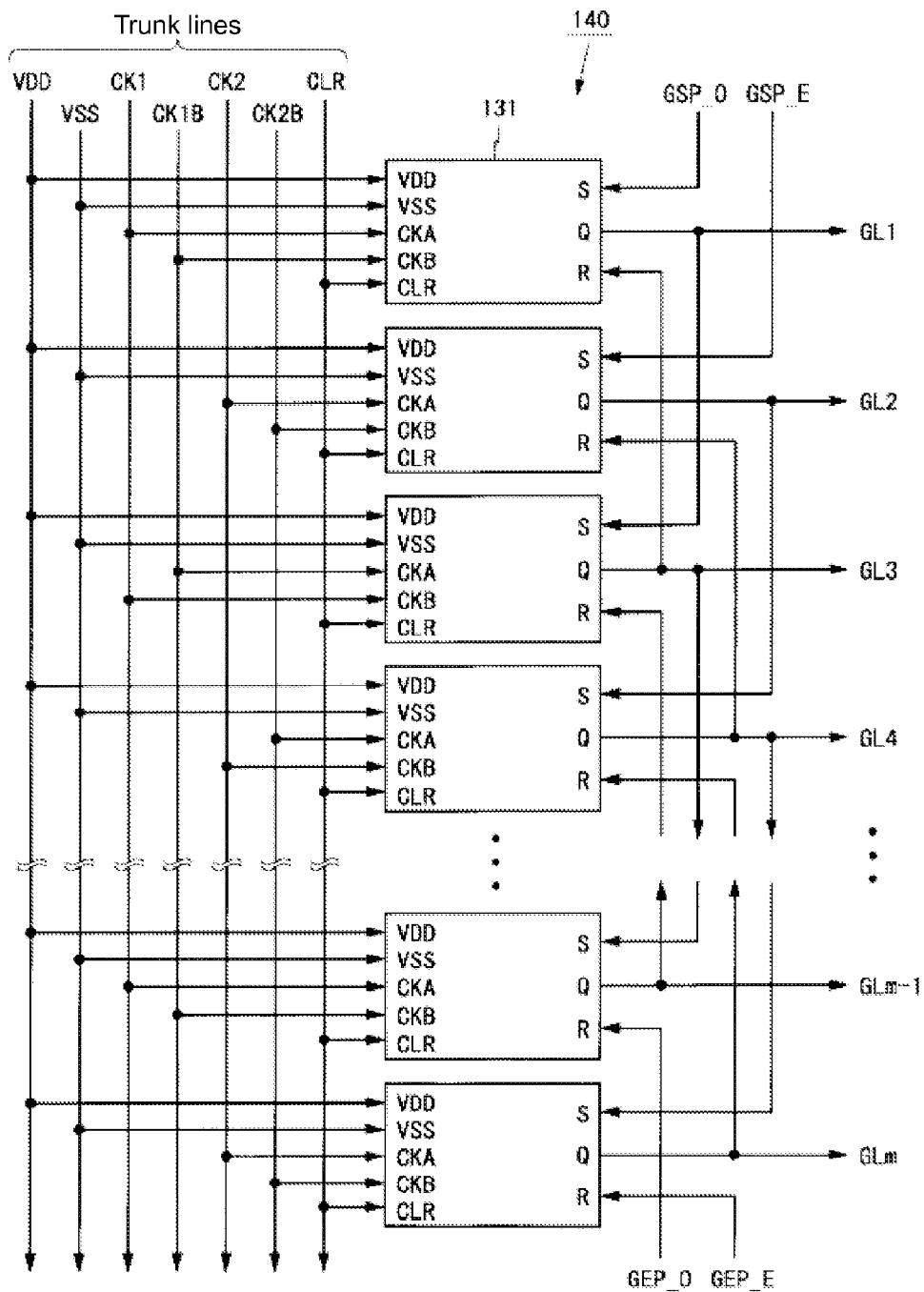
FIG. 23 is a block diagram of a scanning-signal-line driving circuit (fourth example) to which the present invention can be applied.
Figure 24:
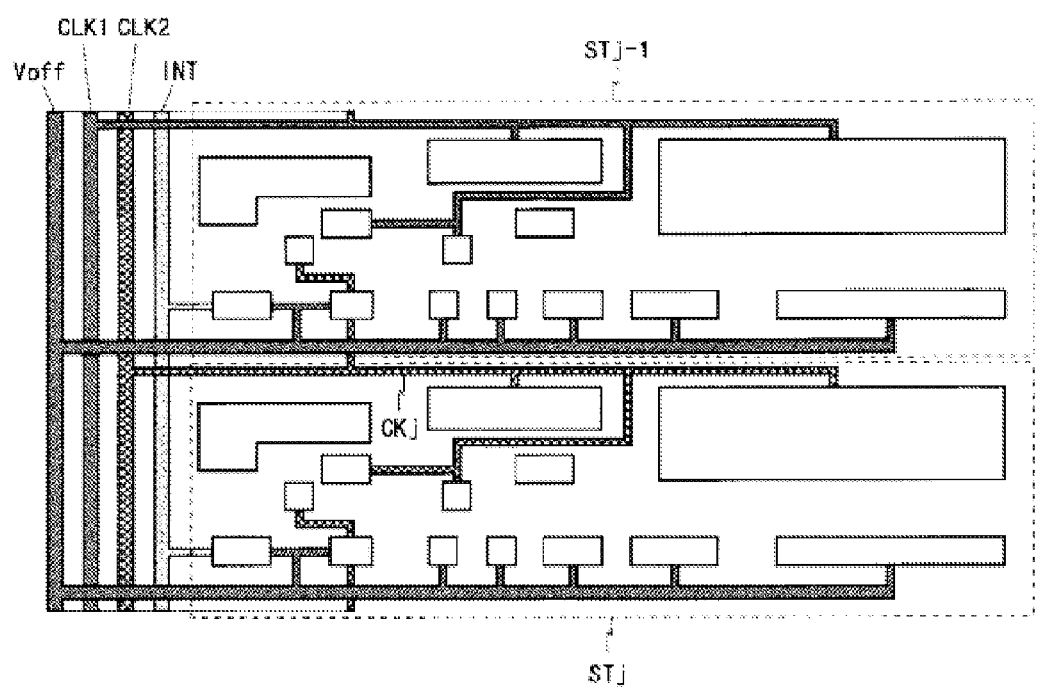
FIG. 24 is a layout diagram of a conventional scanning-signal-line driving circuit.

FIG. 23 is a block diagram of the scanning-signal-line driving circuit according to a fourth example. The scanning-signal-line driving circuit 140 shown in FIG. 23 includes a shift register with odd-numbered stages containing m/2 bistable circuits 131, a shift register with even-numbered stages containing m/2 bistable circuits 131, and trunk lines. The trunk lines include seven wiring lines (a trunk line for a high-level potential VDD, a trunk line for a low-level potential VSS, trunk lines for gate clock signals CK1, CK1B, CK2, and CK2B, and a trunk line for a clear signal CLR). In the fourth example, the present invention can be applied to the supply of the high-level potential VDD and the supply of the low-level potential VSS.

The following fixed potentials and signals are input to the bistable circuits 131 included in the scanning-signal-line driving circuit 140. The high-level potential VDD, the low-level potential VSS, and the clear signal CLR are input to the bistable circuits of all the stages. The gate clock signals CK1 and CK1B are input as the clocks CKA and CKB, respectively to the bistable circuits of the (4k−3)-th stages when k is an integer from one to a specified number. The gate clock signals CK2 and CK2B are input as the clocks CKA and CKB, respectively to the bistable circuits of the (4k−2)-th stages. The gate clock signals CK1B and CK1 are input as the clocks CKA and CKB, respectively to the bistable circuits of the (4k−1)-th stages. The gate clock signals CK2B and CK2 are input as the clocks CKA and CKB, respectively to the bistable circuits of the 4k-th stages. The set signals S and the reset signals R that are the same as in the third example are input to the respective stages of the bistable circuits 131.

The four-phase gate clock signals shown in FIG. 13 are supplied to the scanning-signal-line driving circuit 140, and the first and second gate start pulse signals GSP_O and GSP_E and the first and second gate end pulse signals GEP_O and GEP_E are controlled so as to be at a high level with specified timing only for one horizontal scanning period. Consequently, the pulse that is input to the bistable circuit of the first stage is transferred in sequence to the bistable circuit of the (m−1)-th stage, and the pulse that is input to the bistable circuit of the second stage is transferred in sequence to the bistable circuit of the m-th stage. At this time, the potentials of the scanning signal lines GL1 to GLm sequentially become a high level for one horizontal scanning period at a time with each delaying by a ½ horizontal scanning period (see FIG. 18).

Besides the scanning-signal-line driving circuits according to the first to fourth examples, the present invention can also be applied to a scanning-signal-line driving circuit which includes a shift register having dummy stages on the side of the first stage and on the side of the last stage, a scanning-signal-line driving circuit which includes a shift register that generates a signal which changes in the same manner as the state signal Q and uses this signal as the set signal S and reset signal R, and the like.

Note that up to this point, a liquid crystal display device was described as an example of display devices to which the present invention is applied, but the present invention is not limited to this. The present invention can also be applied to display devices other than a liquid crystal display device such as organic EL (Electro Luminescence) display devices.

Industrial Applicability

The scanning-signal-line driving circuit of the present invention exhibits the effect of being able to reduce the frame area and power consumption when integrally formed on the display panel and can therefore be utilized in various types of display device such as liquid crystal display devices. The display device of the present invention exhibits the effect of being able to reduce the frame area and power consumption of the scanning-signal-line driving circuit and can therefore be utilized for various types of display device such as liquid crystal display devices.

Description of Reference Characters 1 power supply
2 DC/DC converter
3 display control circuit
4, 110, 120, 130, 140 scanning-signal-line driving circuit
5 video-signal-line driving circuit
6 common-electrode driving circuit
7 pixel region
8 pixel circuit
9 TFT
11, 16, 18 shift register
12, 15, 21, 31, 41, 71 trunk line
13, 22, 32, 42, 52, 62, 73 branch line
14, 17, 19, 111, 131 bistable circuit
23, 33, 43, 53, 72 auxiliary line
24, 34, 44, 54, 64 contact
25, 35, 55, 65 internal wiring line
46 clear-use TFT
101, 102 liquid crystal panel

The invention claimed is:

1. A scanning-signal-line driving circuit which drives a plurality of scanning signal lines disposed in the pixel region of a display device, this scanning-signal-line driving circuit comprising:
   a fixed potential-use trunk line for supplying a fixed potential;
   a plurality of branch lines connected to said fixed potential-use trunk line; and
   a single or a plurality of shift registers including a plurality of stages that receive the supply of said fixed potential from said fixed potential-use trunk line via said branch lines,
   wherein all of the stages included in said single or said plurality of shift registers form an array by being disposed in a line in a specified direction,
   wherein the number of said branch lines is smaller than the number of the stages included in said array, and
   wherein the scanning-signal-line driving circuit further comprises an auxiliary line connected to said branch lines and the plurality of stages included in said array.

2. The scanning-signal-line driving circuit according to claim 1, wherein
   the stages included in said array are grouped into respective groups each having a plurality of stages in the order of arrangement,
   one branch line and one auxiliary line are provided for each of said groups, and
   each of said auxiliary lines is connected to the corresponding branch line and the plurality of stages within the corresponding group.

3. The scanning-signal-line driving circuit according to claim 1, wherein said array includes two or more stages having mutually different layouts.

4. The scanning-signal-line driving circuit according to claim 3, wherein said array includes two adjacently disposed stages that share at least one of a wiring line, a contact, and a switching element.

5. The scanning-signal-line driving circuit according to claim 1, wherein
   the stages included in said array are paired with two stages each in the order of arrangement, and
   one of a branch lines is provided for every said two paired stages and is connected to these two stages.

6. The scanning-signal-line driving circuit according to claim 5, wherein said two paired stages have a layout showing line symmetry with respect to a boundary line between said two paired stages as the axis of symmetry.

7. The scanning-signal-line driving circuit according to claim 5, wherein said two paired stages share at least one of a wiring line, a contact, and a switching element.

8. The scanning-signal-line driving circuit according to claim 1, wherein said auxiliary line is connected to all of said branch lines and all of the stages included in said array.

9. The scanning-signal-line driving circuit according to claim 1, wherein said auxiliary line is narrower than said fixed potential-use trunk line.

10. The scanning-signal-line driving circuit according to claim 1, wherein said fixed potential-use trunk line is a wiring line for supplying a low-level fixed potential.

11. The scanning-signal-line driving circuit according to claim 1, wherein said fixed potential-use trunk line is a wiring line for supplying a high-level fixed potential.

12. The scanning-signal-line driving circuit according to claim 1, further comprising:
- a clear signal-use trunk line for supplying a clear signal; and
- a plurality of clear signal-use branch lines connected to said clear signal-use trunk line,
- wherein the number of said clear signal-use branch lines is smaller than the number of the stages included in said array.

13. The scanning-signal-line driving circuit according to claim 1, further comprising:
- a clock signal-use trunk line for supplying a clock signal; and
- a plurality of clock signal-use branch lines connected to said clock signal-use trunk line,
- wherein the number of said clock signal-use branch lines is smaller than the number of the stages that receive the supply of said clock signal from said clock signal-use trunk line among the stages included in said array.

14. A display device comprising:
- a display panel that includes a pixel region in which a plurality of scanning signal lines are disposed; and
- the scanning-signal-line driving circuit according to claim 1 formed on said display panel as an integral unit.

\* \* \* \* \*